US012648281B2

(12) United States Patent
Cho et al.

(10) Patent No.: US 12,648,281 B2
(45) Date of Patent: Jun. 2, 2026

(54) DISPLAY DEVICE INCLUDING LIGHT EMITTING ELEMENTS CONNECTED IN SERIES-PARALLEL CONNECTION

(71) Applicant: Samsung Display Co., LTD., Yongin-si (KR)

(72) Inventors: Hyun Min Cho, Yongin-si (KR); Yo Han Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 18/141,304

(22) Filed: Apr. 28, 2023

(65) Prior Publication Data

US 2023/0361262 A1     Nov. 9, 2023

(30) Foreign Application Priority Data

May 3, 2022    (KR) ......................... 10-2022-0054770

(51) Int. Cl.
H10H 20/857 (2025.01)
G09G 3/32 (2016.01)
(Continued)

(52) U.S. Cl.
CPC ............. H10H 20/857 (2025.01); G09G 3/32 (2013.01); H10D 86/441 (2025.01);
(Continued)

(58) Field of Classification Search
CPC .. H10H 20/857; H10H 20/819; H10H 29/142; H10H 20/8314; G09G 3/32; G09G 2320/0271; G09G 3/3233; G09G 2300/0426; G09G 2300/0439; G09G 2300/0804; G09G 2300/0852;
(Continued)

(56) References Cited

U.S. PATENT DOCUMENTS 7,675,494 B2    3/2010  Hong et al.
10,562,438 B2 *  2/2020  Katsura .................. H05B 45/10
(Continued)

FOREIGN PATENT DOCUMENTS

CN        112634818 A    4/2021
CN        114220392 A    3/2022
(Continued)

OTHER PUBLICATIONS

Extended European Search Report dated Jun. 28, 2023 for corresponding European Application No. 23165732.1 (9 pages).

*Primary Examiner* — Tan N Tran
(74) *Attorney, Agent, or Firm* — Womble Bond Dickinson (US) LLP

(57) ABSTRACT

A display device may include a pixel. The pixel may include: a first electrode, a second electrode, and an intermediate electrode; light emitting elements, at least some of the light emitting elements being connected in series with each other through the intermediate electrode between the first electrode and the second electrode; a driving transistor configured to provide a driving current to the light emitting elements between a first power line and a second power line; and a first switching transistor connected in parallel with some of the light emitting elements and connected in series with remaining ones of the light emitting elements.

20 Claims, 18 Drawing Sheets

LD: LD1, LD2, LD3, LD4

(51) Int. Cl.
    *H10D 86/40*        (2025.01)
    *H10D 86/60*        (2025.01)
    *H10W 90/00*       (2026.01)

(52) U.S. Cl.
    CPC ........... *H10D 86/481* (2025.01); *H10D 86/60*
        (2025.01); *H10W 90/00* (2026.01); *G09G*
                             *2320/0271* (2013.01)

(58) Field of Classification Search
    CPC ... G09G 2320/0626; G09G 2300/0809; G09G
        2300/0842; G09G 2320/062; H01L
        25/0753; H01L 25/167; H10D 86/441;
             H10D 86/481; H10D 86/60
    See application file for complete search history.

(56) References Cited

U.S. PATENT DOCUMENTS

| | | | |
|---|---|---|---|
| 12,288,772 B2 | 4/2025 | Kum et al. | |
| 2021/0225224 A1* | 7/2021 | Liu ........................... | G09G 3/32 |
| 2021/0335216 A1 | 10/2021 | Nie | |
| 2021/0375194 A1 | 12/2021 | Kwag et al. | |
| 2021/0390902 A1 | 12/2021 | Lee et al. | |
| 2022/0415247 A1 | 12/2022 | Liao et al. | |

FOREIGN PATENT DOCUMENTS

| | | |
|---|---|---|
| EP | 3866151 A1 | 8/2021 |
| KR | 10-1139527 B1 | 5/2012 |
| KR | 10-2020-0040347 A | 4/2020 |
| KR | 10-2020-0042075 A | 4/2020 |
| KR | 10-2305951 B1 | 9/2021 |
| KR | 10-2022-0043996 A | 4/2022 |

\* cited by examiner

GL: SCL, SSL, SWL

GL: SCL, SSL, SWL
130: 131, 132
140: 141, 142

<CASE1>

LD: LD1, LD2, LD3, LD4

LD: LD1, LD2, LD3, LD4

LD: LD1, LD2, LD3, LD4

LD: LD1, LD2, LD3, LD4

DISPLAY DEVICE INCLUDING LIGHT EMITTING ELEMENTS CONNECTED IN SERIES-PARALLEL CONNECTION

CROSS-REFERENCE TO RELATED APPLICATION

This application claims priority to and the benefit of Korean Patent Application No. 10-2022-0054770, filed on May 3, 2022, in the Korean Intellectual Property Office, the entire content of which is incorporated by reference herein.

BACKGROUND

1. Field

Various embodiments of the present disclosure relate to a display device.

2. Description of Related Art

Recently, interest in information displays is increasingly growing. Hence, research and development on display devices have been continuously performed.

SUMMARY

Various embodiments of the present disclosure are directed to a display device capable of more accurately representing a low-grayscale image.

The aspects and features of embodiments of the present disclosure are not limited to the above-stated aspects, and those skilled in the art will clearly understand other aspects and features of embodiments of the present disclosure that are not mentioned from the below description.

A display device in accordance with one or more embodiments of the present disclosure may include a pixel. The pixel may include: a first electrode, a second electrode, and an intermediate electrode; light emitting elements, at least some of the light emitting elements being connected in series with each other through the intermediate electrode between the first electrode and the second electrode; a driving transistor configured to provide a driving current to the light emitting elements between a first power line and a second power line; and a first switching transistor connected in parallel with some of the light emitting elements and connected in series with remaining ones of the light emitting elements.

The first electrode may be electrically connected to the first power line through the driving transistor. The second electrode may be electrically connected to the second power line.

The pixel may further include: a hold capacitor between a second electrode of the first switching transistor and a gate electrode of the first switching transistor; and a second switching transistor configured to transmit a mode signal to the gate electrode of the first switching transistor. A first electrode of the first switching transistor is electrically connected to the intermediate electrode.

The second electrode of the first switching transistor may be electrically connected to the second power line.

The display device may further include: a data processor configured to output a determination result by determining whether a grayscale value included in image data is less than a reference grayscale value; and a driver configured to generate the mode signal for turning on or turning off the first switching transistor based on the determination result of the data processor.

When the grayscale value is less than the reference grayscale value, the first switching transistor is turned on, the some of the light emitting elements may not emit light, and the remaining ones of the light emitting elements may emit light.

When the grayscale value is greater than or equal to the reference grayscale value, the first switching transistor may be turned off, and all of the light emitting elements may emit light.

The intermediate electrode may include a first intermediate electrode, a second intermediate electrode, and a third intermediate electrode. The light emitting elements may include: a first light emitting element electrically connected between the first electrode and the first intermediate electrode; a second light emitting element electrically connected between the first intermediate electrode and the second intermediate electrode; a third light emitting element electrically connected between the second intermediate electrode and the third intermediate electrode; and a fourth light emitting element electrically connected between the third intermediate electrode and the second electrode.

The first switching transistor may be turned on to electrically connect the first intermediate electrode to the second power line.

The first switching transistor may be turned on to electrically connect the second intermediate electrode to the second power line.

The first switching transistor may be turned on to electrically connect the third intermediate electrode to the second power line.

Each of the light emitting elements may include an inorganic light emitting diode.

A display device in accordance with one or more embodiments of the present disclosure may include a pixel. The pixel may include: a first pixel electrode, a second pixel electrode, and an intermediate electrode; first light emitting elements electrically connected between the first pixel electrode and the second pixel electrode; second light emitting elements electrically connected between the intermediate electrode and the second pixel electrode; a driving transistor configured to transmit a driving current to the first pixel electrode or the second pixel electrode between a first power line and a second power line; and a first switching transistor configured to electrically connect the first pixel electrode to the intermediate electrode or electrically separate the first pixel electrode from the intermediate electrode.

The first pixel electrode may be electrically connected to the first power line through the driving transistor. The second pixel electrode may be electrically connected to the second power line.

The second pixel electrode may be electrically connected to the first power line through the driving transistor. The first pixel electrode may be electrically connected to the second power line.

When the first switching transistor is turned off, the first light emitting elements may emit light, and the second light emitting elements may not emit light. When the first switching transistor is turned on, the first light emitting elements and the second light emitting elements may emit light.

The pixel may further include: a hold capacitor between a second electrode of the first switching transistor and a gate electrode of the first switching transistor; and a second switching transistor configured to transmit a mode signal to the gate electrode of the first switching transistor.

The display device may further include: a data processor configured to output a determination result by determining whether a grayscale value included in image data is less than a reference grayscale value; and a driver configured to generate the mode signal for turning on or turning off the first switching transistor based on the determination result of the data processor.

When the grayscale value is less than the reference grayscale value, the first switching transistor may be turned on.

When the grayscale value is greater than or equal to the reference grayscale value, the first switching transistor may be turned off.

Details of various embodiments are included in the detailed descriptions and drawings.

DETAILED DESCRIPTION

Figure 1:
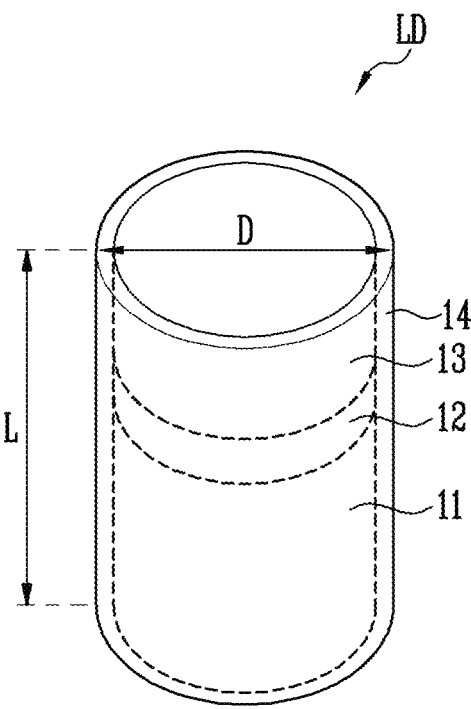
FIG. 1 is a perspective view illustrating a light emitting element in accordance with one or more embodiments.

Reference will now be made in detail to various embodiments of the present disclosure, specific examples of which are illustrated in the accompanying drawings and described below, because the embodiments of the present disclosure can be variously modified in many different forms. Furthermore, a singular form may include a plural form as long as it is not specifically mentioned in a sentence.

Some embodiments are described in the accompanying drawings in connection with functional blocks, units and/or modules. Those skilled in the art will understand that such blocks, units, and/or modules are physically implemented by logic circuits, discrete components, microprocessors, hardwired circuits, memory elements, line connections, and other electronic circuits. This may be formed using semiconductor-based fabrication techniques or other fabrication techniques. For blocks, units, and/or modules implemented by a microprocessor or other similar hardware, they may be programmed and controlled using software to perform various functions discussed herein, and may be optionally driven by firmware and/or software. In addition, each block, unit, and/or module may be implemented by dedicated hardware, or may be implemented by a combination of the dedicated hardware that performs some functions and a processor that performs different functions (e.g., one or more programmed microprocessors and related circuits). Furthermore, in some embodiments, blocks, units and/or modules may be physically separated into two or more individual blocks, units and/or modules that interact with each other without departing from the scope of the present disclosure. In some embodiments, blocks, units and/or modules may be physically combined into more complex blocks, units and/or modules without departing from the scope of the present disclosure.

However, the present disclosure is not limited to the following embodiments and may be modified into various forms. Each embodiment to be described below may be implemented alone, or combined with at least another embodiment to make various combinations of embodiments.

Some elements that are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

Figure 2:
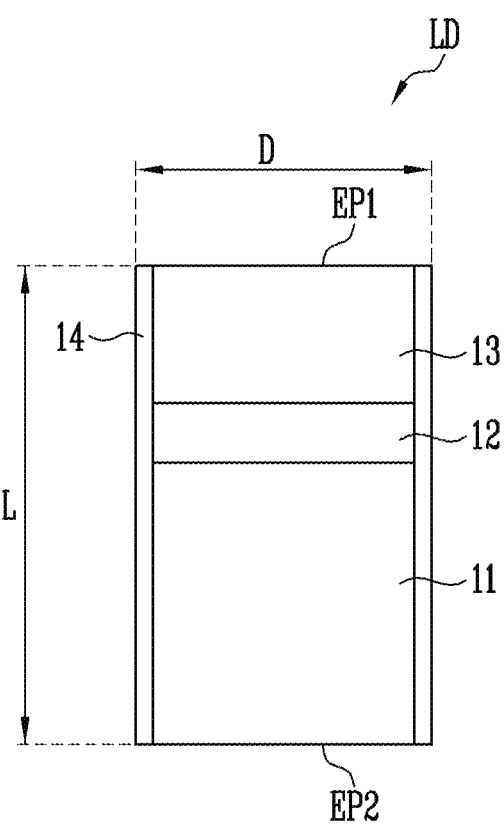
FIG. 2 is a sectional view illustrating the light emitting element in accordance with one or more embodiments.

FIG. 1 is a perspective view illustrating a light emitting element LD in accordance with one or more embodiments. FIG. 2 is a sectional view illustrating the light emitting element LD in accordance with one or more embodiments. Although FIGS. 1 and 2 illustrate a pillar-type light emitting element LD, the type and/or shape of the light emitting element LD is not limited thereto.

Referring to FIGS. 1 and 2, the light emitting element LD may include a first semiconductor layer 11, an active layer 12, and a second semiconductor layer 13. If an extension direction of the light emitting element LD is referred to as a longitudinal direction (L), the first semiconductor layer 11, the active layer 12, and the second semiconductor layer 13 may be successively stacked in the longitudinal direction (L).

The light emitting element LD may be provided in a pillar-like shape extending in one direction. The light emitting element LD may include a first end EP1 and a second end EP2. One of the first and second semiconductor layers 11 and 13 may be disposed on the first end EP1 of the light emitting element LD. The other one of the first and second semiconductor layers 11 and 13 may be disposed on the second end EP2 of the light emitting element LD.

In one or more embodiments, the light emitting element LD may be a light emitting element fabricated in a column shape by an etching scheme or the like. In this specification, the term "pillar-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size corresponding to a range from the nanometer scale to the micrometer scale. For example, the light emitting element LD may have a diameter D (or a width) and/or a length L ranging from the nanometer scale to the micrometer scale.

However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include an n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant such as Si, Ge, or Sn. However, the material for forming the first semiconductor layer 11 is not limited thereto, and the first semiconductor layer 11 may be formed of various other materials.

The active layer 12 may be disposed on the first semiconductor layer 11 and have a single-quantum well structure or a multi-quantum well structure. The active layer 12 may include GaN, InGaN, InAlGaN, AlGaN, or AlN. In addition, various other materials may be used to form the active layer 12. In one or more embodiments, a cladding layer doped with a conductive dopant may be formed on and/or under the active layer 12. For example, the cladding layer may be formed of AlGaN or InAlGaN.

The second semiconductor layer 13 may be disposed on the active layer 12 and include a semiconductor layer of a type different from that of the first semiconductor layer 11. For example, the second semiconductor layer 13 may include a p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant such as Mg. However, the material for forming the second semiconductor layer 13 is not limited thereto, and various other materials may be used to form the second semiconductor layer 13.

If a voltage equal to or greater than a threshold voltage is applied between the opposite ends (e.g., EP1, EP2) of the light emitting element LD, the light emitting element LD may emit light by recombining of electron-hole pairs in the active layer 12. Because light emission of the light emitting element LD can be controlled based on the foregoing principle, the light emitting element LD may be used as a light source of various light emitting devices as well as a pixel of the display device.

The light emitting element LD may further include an insulating film 14 provided on a surface of the light emitting element LD. The insulating film 14 may be formed on the surface of the light emitting element LD to enclose an outer surface (e.g., an outer peripheral or circumferential surface) of at least the active layer 12, and may further enclose (or partially enclose) one area of each of the first and second semiconductor layers 11 and 13.

In one or more embodiments, the insulating film 14 may allow the opposite ends (e.g., EP1, EP2) of the light emitting element LD that have different polarities to be exposed to the outside. For example, the insulating film 14 allows one end of each of the first and second semiconductor layers 11 and 13 disposed on the first and second ends EP1 and EP2 of the light emitting element LD to be exposed. In one or more embodiments, the insulating film 14 allows a side portion of each of the first and second semiconductor layers 11 and 13 adjacent to the first and second ends EP1 and EP2 of the light emitting element LD having different polarities to be exposed.

In one or more embodiments, the insulating film 14 may have a single-layer structure or a multi-layer structure (e.g., a double-layer structure formed of aluminum oxide (AlO$_x$) and silicon oxide (SiO$_x$)) including at least one insulating material among silicon oxide (SiO$_x$), silicon nitride (SiN$_x$), silicon oxynitride (SiO$_x$N$_y$), aluminum oxide (AlO$_x$), and titanium oxide (TiO$_x$). However, the present disclosure is not limited thereto. In one or more embodiments, the insulating film 14 may be omitted.

In case that the insulating film 14 is provided to cover the surface of the light emitting element LD, particularly, an outer surface (e.g., an outer peripheral or circumferential surface) of the active layer 12, the active layer 12 may be prevented from short-circuiting with a first contact electrode or a second contact electrode to be described below. Consequently, the electrical stability of the light emitting element LD may be secured.

If the insulating film 14 is provided on the surface (e.g., the outer peripheral or circumferential surface) of the light emitting element LD, occurrence of a defect on the surface of the light emitting element LD may be reduced or minimized, whereby the lifetime and efficiency of the light emitting element LD may be improved. In addition, even in case that a plurality of light emitting elements LD are disposed adjacent to each other, an undesired short-circuit may be prevented from occurring between the light emitting elements LD.

In one or more embodiments, the light emitting element LD may further include an additional component as well as the first semiconductor layer 11, the active layer 12, the second semiconductor layer 13, and/or the insulating film 14 that encloses the first semiconductor layer 11, the active layer 12, and the second semiconductor layer 13. For example, the light emitting element LD may further include at least one fluorescent layer, at least one active layer, at least one semiconductor layer and/or at least one electrode layer disposed on one end of the first semiconductor layer 11, the active layer 12, and/or the second semiconductor layer 13. For example, a contact electrode layer may be disposed on each of the first and second ends EP1 and EP2 of the light emitting element LD. Although FIGS. 1 and 2 illustrate a column-type light emitting element LD, the type, the structure, and/or the shape of the light emitting element LD may be changed in various ways. For example, the light emitting element LD may be formed of a core-shell structure having a polypyramid shape.

A light emitting device including the light emitting element LD described above may be used not only in a display device but also in various devices that require a light source. For instance, a plurality of light emitting elements LD may be disposed in each pixel of a display panel, so that the light emitting elements LD may be used as a light source of the pixel. However, the application field of the light emitting element LD is not limited to the foregoing examples. For example, the light emitting element LD may also be used in other types of devices such as a lighting device, which requires a light source.

In the case where the light emitting element LD includes inorganic material such as GaN, InGaN, InAlGaN, AlGaN, or AlN, a peak wavelength of light emitted from the light emitting element LD may be shifted depending on current flowing through the light emitting element LD. For example, as the magnitude of driving current is reduced, the quantity (or the irradiance) of light emitted from the light emitting element LD may be reduced, and the peak wavelength (i.e., a wavelength having the maximum irradiance) of the light may lengthen or shorten.

For example, in the case where the light emitting element LD is a light emitting element that includes GaN-based (or InGaN-based) inorganic material and may emit blue light, the peak wavelength of the light emitting element LD may lengthen from approximately 455 nm to approximately 463 nm as current is reduced. For example, in the case where the light emitting element LD is a light emitting element that includes AlGaInP-based (or GaP- or GaInP-based) inorganic material and may emit red light, the peak wavelength of the light emitting element LD may shorten from approximately 640 nm to approximately 630 nm as current is reduced. Due to a change in peak wavelength of the light emitting element LD, it may be difficult to represent a full-color image with accurate color coordinates within an overall luminance range only by controlling current, or color space (or color gamut) may be changed depending on current (or luminance corresponding to the current). For example, color gamut for a low-grayscale image using relatively low current may be smaller than color gamut for a low-grayscale image using relatively high current. Hence, there is no alternative but for representation performance for low-grayscale images to be relatively low.

Therefore, the representation performance (or display quality) for low-grayscale images may be enhanced by adjusting the number of light emitting elements LD that validly emit light, as well as by adjusting the current. For example, a change in peak wavelength (or color coordinates or color gamut) may be reduced or minimized by relatively increasing current flowing through the light emitting element LD in response to a low-grayscale image, and an image may be displayed at a luminance corresponding to a low gray scale by adjusting (e.g., reducing) the number of light emitting elements LD that validly emit light in response to (e.g., in reverse proportion to) the increased current.

Figure 3:
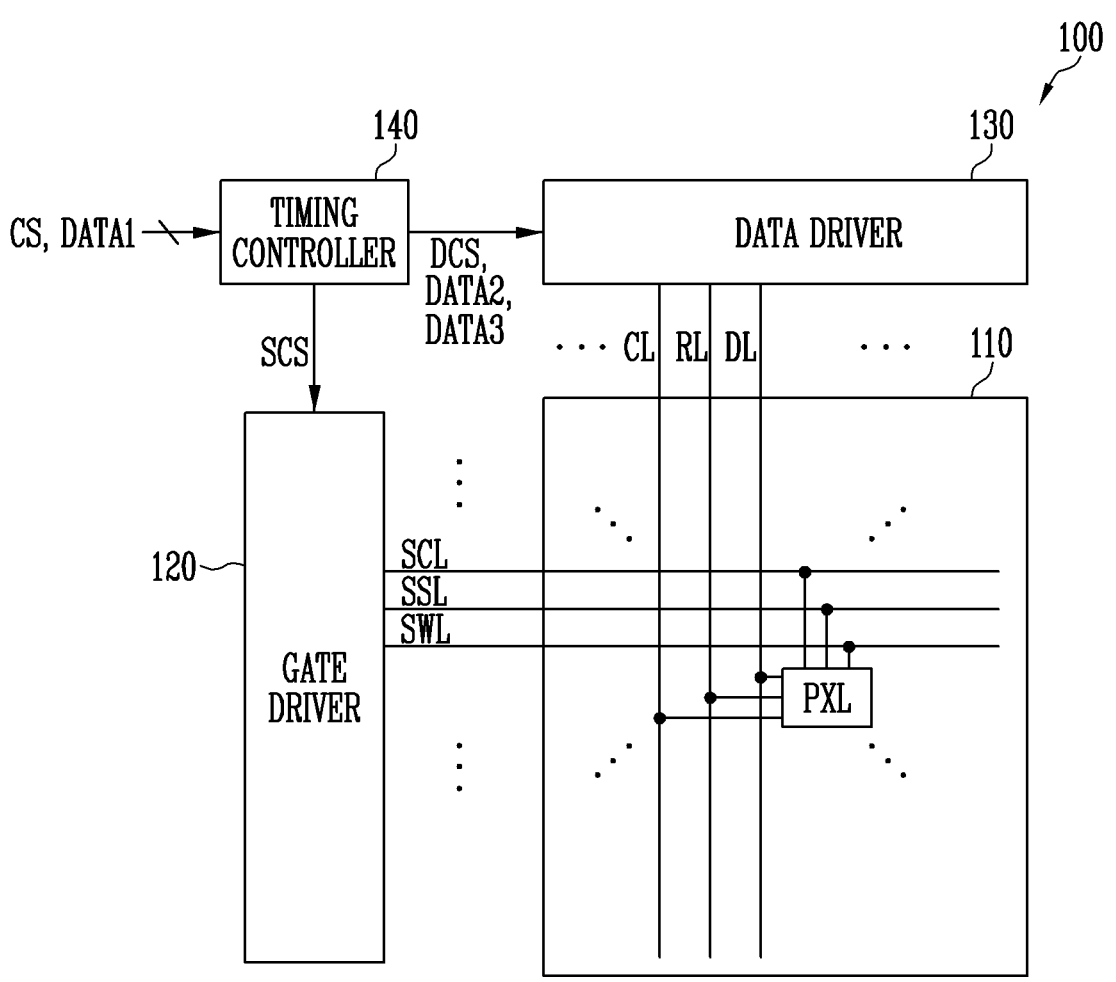
FIG. 3 is a block diagram illustrating a display device in accordance with one or more embodiments of the present disclosure.
Figure 4:
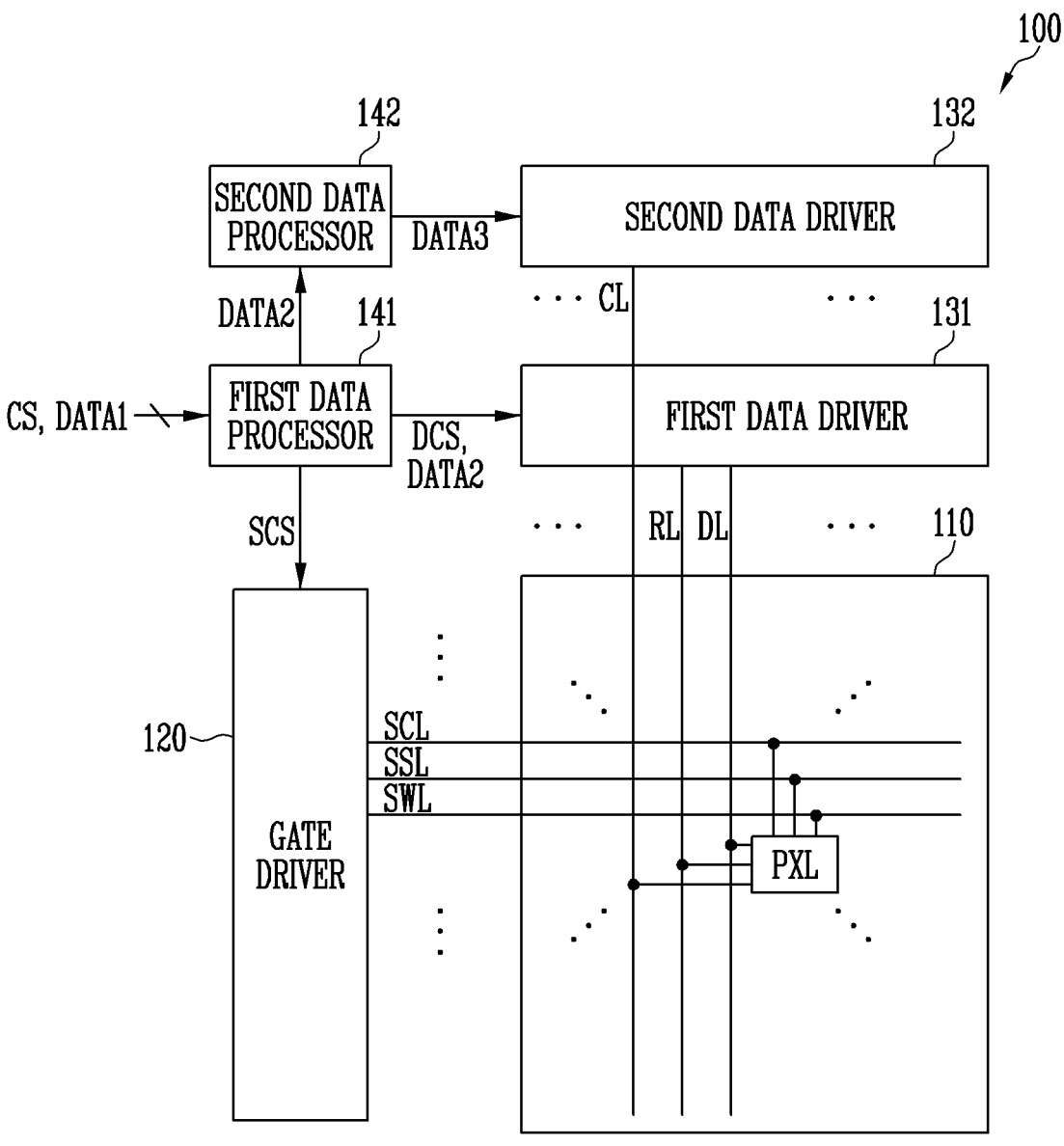
FIG. 4 is a block diagram illustrating an embodiment of the display device of FIG. 3.

FIG. 3 is a block diagram illustrating a display device 100 in accordance with one or more embodiments of the present disclosure. FIG. 4 is a block diagram illustrating an embodiment of the display device 100 of FIG. 3.

Referring to FIGS. 3 and 4, the display device 100 may include a display unit 110 (or a display panel), a gate driver 120 (or a scan driver), a data driver 130 (or a source driver), and a timing controller 140.

The display unit 110 may display an image. The display unit 110 may include a gate line GL, a data line DL, a readout line RL (or a sensing line), a control line CL, and a pixel PXL. The gate line GL may include a scan line SCL (or a first gate line), a sensing scan line SSL (or a second gate line), and a switching scan line SWL (or a third gate line). The scan line SCL, the sensing scan line SSL, the switching scan line SWL, the data line DL, the readout line RL, the control line CL, and the pixel PXL each may be provided in a plural number.

The pixel PXL may be disposed or located in an area (e.g., a pixel area) defined by the scan line SCL and the data line DL.

The pixel PXL may be connected to the scan line SCL, the sensing scan line SSL, the switching scan line SWL, the data line DL, the readout line RL, and the control line CL.

The pixel PXL may be initialized using a reference voltage (or an initialization voltage) provided through the readout line RL in response to a sensing scan signal provided through the sensing scan line SSL, may store or record a data signal (or a data voltage) provided through the data line DL in response to a scan signal provided through the scan line SCL, or may emit light at a luminance corresponding to the stored data signal. Here, a voltage level of the reference voltage may be set to a value lower than an operating point (or a threshold voltage) of a light emitting element in the pixel PXL, but the present disclosure is not limited thereto. Furthermore, the pixel PXL may store or record a mode signal (or a switching signal) provided through the control line CL in response to a switching scan signal provided through the switching scan line SWL, and may adjust the number of light emitting elements that validly emit light in the pixel PXL in response to the mode signal.

Detailed configuration of the pixel PXL will be described below with reference to FIG. 5.

The gate driver 120 may generate a scan signal based on a scan control signal SCS (or a gate control signal), and provide the scan signal to the scan line SCL. Here, the scan control signal SCS may include a start signal, clock signals, and the like, and may be provided from the timing controller 140 to the gate driver 120. For example, the gate driver 120 may be implemented as a shift register configured to successively shift a pulse-type start signal based on the clock signals and generate and output the scan signal. Furthermore, in a manner similar to a scheme of generating the scan signal, the gate driver 120 may generate a sensing scan signal and provide the sensing scan signal to the sensing scan line SSL, and generate a switching scan signal and provide the switching scan signal to the switching scan line SWL.

The gate driver 120 along with the pixel PXL may be formed on the display unit 110. However, the gate driver 120 is not limited thereto. For example, the gate driver 120 may be implemented as an integrated circuit and mounted on a circuit film, and may be connected to the timing controller 140 via at least one circuit film and a printed circuit board.

The data driver 130 may generate a data signal (or a data voltage) based on image data DATA2 (or second data) and a data control signal DCS that are provided from the timing controller 140, and may provide the data signal to the display unit 110 (or the pixel PXL) through the data line DL. Here, the data control signal DCS may be a signal for controlling the operation of the data driver 130, and include a load signal (or a data enable signal) for instructing to output a valid data signal, a horizontal start signal, a data clock signal, and the like. Furthermore, the data driver 130 may provide a reference voltage to the display unit 110 (or the pixel PXL) through the readout line RL.

In addition, the data driver 130 may provide a test signal (or a test voltage) to the pixel PXL through the data line DL and receive a sensing signal from the pixel PXL through the readout line RL, in a separate sensing mode or a sensing period (e.g., a sensing period allocated to sense electrical characteristics of the pixel PXL such as a threshold voltage and/or mobility of the driving transistor included in the pixel PXL). The sensing signal may be used to at least one of the data driver 130 and the timing controller 140 to compensate for the electrical characteristics (or a characteristic deviation) of the pixel PXL.

In one or more embodiments, the data driver 130 may generate a mode signal (or a switching signal) based on mode data DATA3 (or third data, or switching data) provided from the timing controller 140, and provide the mode signal to the display unit 110 (or the pixel PXL) through the control line CL. The mode data DATA3 may include a mode value (or a switching value) indicating whether a grayscale value of the pixel PXL is less than a reference grayscale value. For example, the reference grayscale value may be a grayscale value of 32, a grayscale value of 80, or the like, from among grayscale values (or gray scales) ranging from 0 to 255. A mode value of 0 may indicate that the grayscale value is a low grayscale value lower than the reference grayscale value. A mode value of 1 may indicate that the grayscale value is a high grayscale value (or an intermediate grayscale value) greater than or identical to the reference grayscale value. However, the mode value is not limited thereto.

In one or more embodiments, the data driver 130 may include a first driver 131 configured to generate a data signal, and a second driver 132 configured to generate a mode signal.

For example, the first driver 131 may include a shift register configured to shift a horizontal start signal in synchronization with the data clock signal and generate a sampling signal, a latch configured to latch the image data DATA2 in response to the sampling signal, a digital-analog converter (or a decoder) configured to convert the latched image data DATA2 (e.g., digital data) to an analog data signal, and a buffer (or an amplifier) configured to output the data signal to the data line DL.

For example, the second driver 132 may be implemented in a manner substantially identical or similar to the first driver 131, and may generate a mode signal based on the mode data DATA3, and output the mode signal to the control line CL.

The timing controller 140 may receive input image data DATA1 and a control signal CS from an external device (e.g., a graphic processor), generate a scan control signal SCS and a data control signal DCS based on the control signal CS, and generate image data DATA2 by converting the input image data DATA1. Here, the control signal CS may include a vertical synchronization signal, a horizontal synchronization signal, a reference clock signal, and the like. The vertical synchronization signal may refer to a start of frame data (i.e., data corresponding to a frame period in which one frame image is displayed). The horizontal synchronization signal may refer to a start of a data row (i.e., one data row from among a plurality of data rows included in the frame data). For example, the timing controller 140 may convert the input image data DATA1 to the image data DATA2 having a format corresponding to pixel arrangement in the display unit 110.

In one or more embodiments, the timing controller 140 may generate mode data DATA3 based on the image data DATA2. For example, the timing controller 140 may produce a mode value by comparing a grayscale value included in the image data DATA2 with the reference grayscale value, and output the mode data DATA3 including the mode value.

In one or more embodiments, the timing controller 140 may include a first data processor 141 configured to generate the image data DATA2, and a second data processor 142 configured to generate the mode data DATA3. For example, the first data processor 141 may be implemented as a general timing controller configured to generate the image data DATA2 based on a vertical synchronization signal, a horizontal synchronization signal, and an RGB signal. For example, the second data processor 142 may include a computation circuit that compares a grayscale value of the image data DATA2 with the reference grayscale value and outputs a comparison result or determines whether the grayscale value is less than the reference grayscale value and outputs a determination result. In one or more embodiments, the second data processor 142 may further include a buffer (or a memory) configured to store the grayscale value of the image data DATA2 and a buffer (or an amplifier) configured to output the comparison result (or the determination result, i.e., a mode value).

In one or more embodiments, the display device 100 may further include a power supply. The power supply may supply a first power voltage and a second power voltage to the display unit 110. The first and second power voltages may be power voltages needed to operate the pixel PXL, or voltages of a driving power supply. Furthermore, the power supply may provide the reference voltage to the data driver 130. In addition, the power supply may provide driving voltages (e.g., a turn-on voltage, and a turn-off voltage) to at least one of the gate driver 120, the data driver 130, and the timing controller 140. The power supply may be implemented as a power management IC (PMIC).

The data driver 130 and the timing controller 140 each may be implemented as a separate integrated circuit, but the present disclosure is not limited thereto. For example, the data driver 130 and the timing controller 140 may be implemented as a single integrated circuit. In one or more embodiments, at least two of the gate driver 120, the data driver 130, and the timing controller 140 may be implemented as a single integrated circuit.

Figure 5:
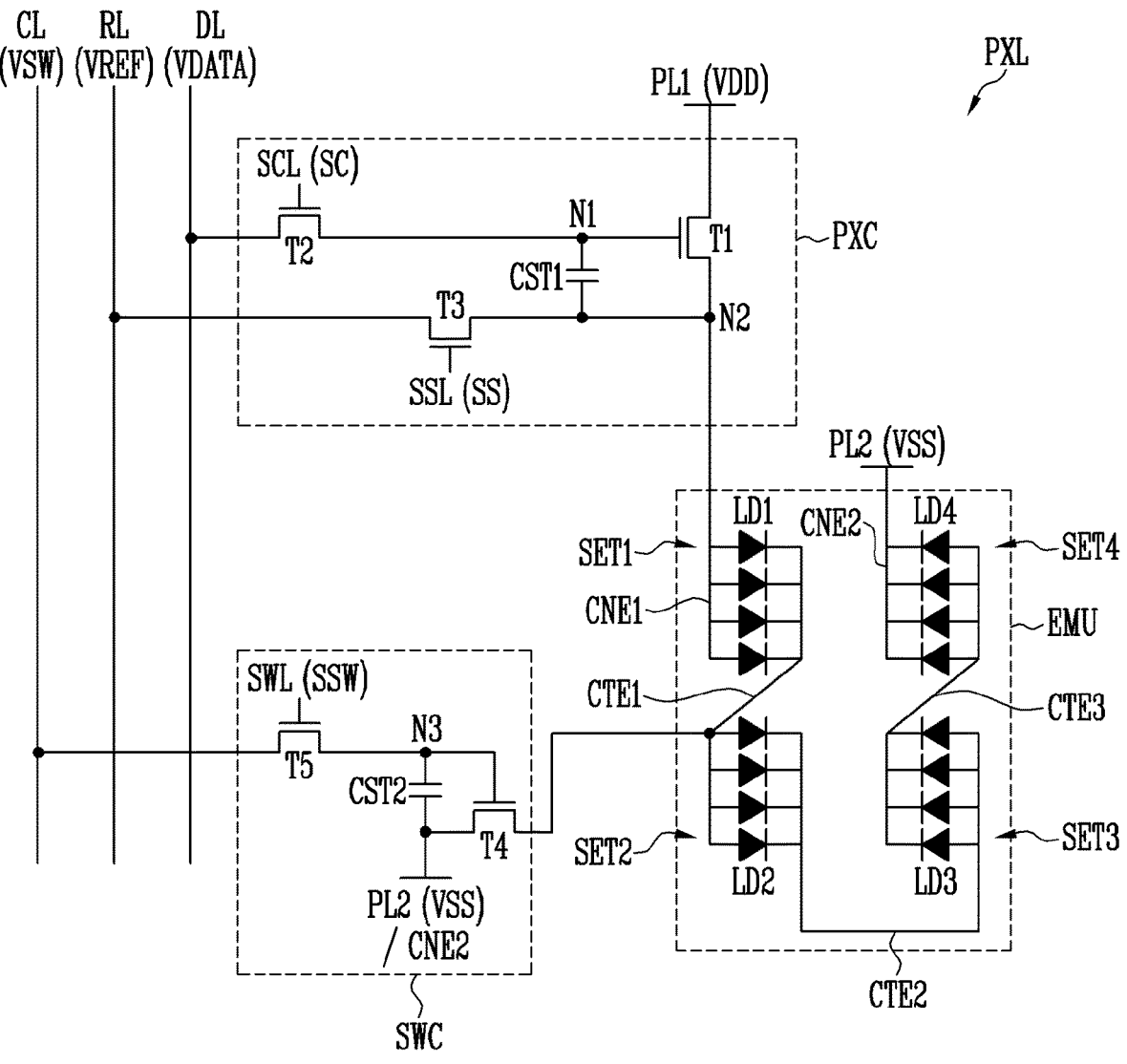
FIG. 5 is a circuit diagram illustrating an embodiment of a pixel included in the display device of FIG. 3.

FIG. 5 is a circuit diagram illustrating an embodiment of the pixel PXL included in the display device of FIG. 3. FIG. 5 illustrates an electrical connection relationship of components included in the pixel PXL that may be employed in an active matrix type display device in accordance with one or more embodiments. Here, the connection relationship of the components of the pixel PXL is not limited thereto.

Referring to FIGS. 3 to 5, the pixel PXL may include an emission component EMU (or an emission unit) configured to generate light having a luminance corresponding to a data signal. Furthermore, the pixel PXL may optionally further include a pixel circuit PXC configured to drive the emission component EMU. Furthermore, the pixel PXL may further include a switching circuit SWC configured to change the connection configuration of series sets SET1 to SET4 (or the light emitting elements LD) in the emission component EMU. The terms "switching circuit SWC" and "pixel circuit PXC" are used only to distinguish the circuits from each other depending on the functions of the circuits. For example, the switching circuit SWC may be included in the pixel circuit PXC.

In one or more embodiments, the emission component EMU may include a plurality of light emitting elements LD at least some of which are connected in series to each other between a first power line PL1 and a second power line PL2 by an intermediate electrode. Each of the light emitting elements LD may be formed of an inorganic light emitting diode described with reference to FIGS. 1 and 2, but it is not limited thereto. The first power line PL1 may be connected to the first driving power supply VDD and supplied with a voltage of the first driving power supply VDD. The second power line PL2 may be connected to the second driving power supply VSS and supplied with a voltage of the second driving power supply VSS. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

In one or more embodiments, the emission component EMU may include at least one series set (or stage). Each series set may include a pair of electrodes (e.g., two electrodes), and at least one light emitting element LD connected in a forward direction between the pair of electrodes. Here, the number of series sets that form the emission component EMU and the number of light emitting elements LD that form each series set are not particularly limited. For example, the emission component EMU may include two, three, five, or more series sets. Unlike the foregoing, the emission component EMU may include only one series set. For example, the numbers of light emitting elements LD that form the respective series sets may be identical to or different from each other. The number of light emitting elements LD of each series set is not particularly limited.

In one or more embodiments, the emission component EMU may include a first series set SET1 including at least one first light emitting element LD1, a second series set SET2 including at least one second light emitting element LD2, a third series set SET3 including at least one third light emitting element LD3, and a fourth series set SET4 including at least one fourth light emitting element LD4.

The first series set SET1 may include at least one first light emitting element LD1 connected between a first contact electrode CNE1 (or a first pixel electrode) and a first intermediate electrode CTE1. Each first light emitting element LD1 may be connected in the forward direction between the first contact electrode CNE1 and the first intermediate electrode CTE1. For example, a first end of the first light emitting element LD1 may be connected to the first contact electrode CNE1, and a second end of the first light emitting element LD1 may be connected to the first intermediate electrode CTE1. The terms "contact electrode" and "intermediate electrode" are merely used to distinguish the electrodes from each other, and do not limit the corresponding components (i.e., the electrodes).

The second series set SET2 may include at least one second light emitting element LD2 connected between the first intermediate electrode CTE1 and a second intermediate electrode CTE2. Each second light emitting element LD2 may be connected in the forward direction between the first intermediate electrode CTE1 and the second intermediate electrode CTE2. For example, a first end of the second light emitting element LD2 may be connected to the first intermediate electrode CTE1, and a second end of the second light emitting element LD2 may be connected to the second intermediate electrode CTE2.

The third series set SET3 may include at least one third light emitting element LD3 connected between the second intermediate electrode CTE2 and a third intermediate electrode CTE3. Each third light emitting element LD3 may be connected in the forward direction between the second intermediate electrode CTE2 and the third intermediate electrode CTE3. For example, a first end of the third light emitting element LD3 may be connected to the second intermediate electrode CTE2, and a second end of the third light emitting element LD3 may be connected to the third intermediate electrode CTE3.

The fourth series set SET4 may include at least one fourth light emitting element LD4 connected between the third intermediate electrode CTE3 and a second contact electrode CNE2 (or a second pixel electrode). Each fourth light emitting element LD4 may be connected in the forward direction between the third intermediate electrode CTE3 and the second contact electrode CNE2. For example, a first end of the fourth light emitting element LD4 may be connected to the third intermediate electrode CTE3, and a second end of the fourth light emitting element LD4 may be connected to the second contact electrode CNE2.

A 1st electrode of the emission component EMU, e.g., the first contact electrode CNE1, may be an anode electrode of the emission component EMU. A last electrode of the emission component EMU, e.g., the second contact electrode CNE2, may be a cathode electrode of the emission component EMU.

In case that the light emitting elements LD are connected to have a series/parallel structure, power efficiency may be enhanced, compared to the case where an equal number of light emitting elements LD are connected only in parallel to each other. Furthermore, in the pixel PXL in which the light emitting elements LD are connected to have the series/parallel structure, even if a short-circuit defect or the like occurs in some series sets, certain luminance can be represented by the light emitting elements LD of the other series sets, so that the probability of occurrence of a black spot defect in the pixel PXL can be reduced. However, the present disclosure is not limited thereto. The emission component EMU may be formed by connecting the light emitting elements LD only in series. Alternatively, the emission component EMU may be formed by connecting the light emitting elements LD only in parallel.

Each of the light emitting elements LD may include a first end (e.g., a p-type end) connected to the first driving power supply VDD via at least one electrode (e.g., the first contact electrode CNE1), the pixel circuit PXC, the first power line PL1, and/or the like, and a second end (e.g., an n-type end) connected to the second driving power supply VSS via at least another electrode (e.g., the second contact electrode CNE2), the second power line PL2, and the like. In other words, the light emitting elements LD may be connected in the forward direction between the first driving power supply VDD and the second driving power supply VSS. The light emitting elements LD connected in the forward direction may form valid light sources of the emission component EMU.

The light emitting elements LD may emit, when driving current is supplied thereto through the corresponding pixel circuit PXC, light having luminance corresponding to the driving current. For example, during each frame period, the pixel circuit PXC may supply driving current corresponding to a grayscale value to be represented in the corresponding frame to the emission component EMU. Hence, the light emitting elements LD may emit light having luminance corresponding to the driving current, so that the emission component EMU may represent the luminance corresponding to the driving current.

The pixel circuit PXC may be connected to the scan line SCL and the data line DL of the pixel PXL. Furthermore, the pixel circuit PXC may be connected to the sensing scan line SSL and the readout line RL of the pixel PXL. For example, when the pixel PXL is disposed on an i-th row and a j-th column of the display unit 110 (refer to FIG. 3), the pixel circuit PXC of the pixel PXL may be connected to an i-th scan line SCL, a j-th data line DL, an i-th sensing scan line SSL, and a j-th readout line RL.

The pixel circuit PXC may include transistors T1 to T3 and a first storage capacitor CST1.

The first transistor T1 may be a driving transistor configured to control driving current to be applied to the emission component EMU, and may be connected between the first driving power supply VDD and the emission component EMU. In detail, a first terminal (or a first transistor electrode) of the first transistor T1 may be electrically connected to the first driving power supply VDD through the first power line PL1. A second terminal (or a second transistor electrode) of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission component EMU through the second node N2. In one or more embodiments, the first terminal of the first transistor T1 may be a drain electrode, and the second terminal of the first transistor T1 may be a source electrode, and the present disclosure is not limited thereto. In one or more embodiments, the first terminal may be a source electrode, and the second terminal may be a drain electrode.

The second transistor T2 may be a switching transistor that selects a pixel PXL in response to a scan signal SC and activates the pixel PXL, and may be connected between the data line DL and the first node N1. A first terminal of the second transistor T2 may be connected to the data line DL. A second terminal of the second transistor T2 may be connected to the first node N1. A gate electrode of the second transistor T2 may be connected to the scan line SCL. The first terminal and the second terminal of the second transistor T2 are different terminals, and, for example, if the first terminal is a drain electrode, and the second terminal may be a source electrode.

When a scan signal SC having a gate-on voltage (e.g., a high level voltage) is supplied from the scan line SCL, the second transistor T2 may be turned on to electrically connect the data line DL with the first node N1. The first node N1 may be a point at which the second terminal of the second transistor T2 and the gate electrode of the first transistor T1 are connected to each other. The second transistor T2 may transmit a data signal VDATA to the gate electrode of the first transistor T1.

The third transistor T3 may be an initialization transistor configured to initialize the second node N2, and may be turned on when a sensing scan signal SS is supplied thereto from the sensing scan line SSL, so that an initialization voltage VREF can be transmitted to the second node N2. Hence, the second node N2 (and a second capacitor electrode of the first storage capacitor CST1 electrically connected thereto) may be initialized. A second terminal of the third transistor T3 may be connected to the second terminal of the first transistor T1. A first terminal of the third transistor T3 may be connected to the readout line RL. A gate electrode of the third transistor T3 may be connected to the sensing scan line SSL. Furthermore, in the case in which the third transistor T3 connects the second node N2 to the readout line RL, a sensing signal is obtained through the readout line RL. The sensing signal may be used to detect characteristics of the pixel PXL such as the threshold voltage of the first transistor T1. Information about the characteristics of the pixel PXL may be used to convert image data such that a deviation in characteristic between pixels PXL can be compensated for.

The first storage capacitor CST1 may be formed or electrically connected between the first node N1 and the second node N2. The first storage capacitor CST1 may include a first capacitor electrode (or a first electrode) and a second capacitor electrode (or a second electrode). The first capacitor electrode of the first storage capacitor CST1 may be electrically connected to the first node N1. The second capacitor electrode of the first storage capacitor CST1 may be electrically connected to the second node N2. The first storage capacitor CST1 may be charged with a voltage corresponding to a data signal VDATA to be supplied to the first node N1 during each frame period. Hence, the first storage capacitor CST1 may store a voltage corresponding to a difference between a voltage of the gate electrode of the first transistor T1 and a voltage of the second node N2.

The switching circuit SWC may be connected to the switching scan line SWL and the control line CL of the pixel PXL. For example, when the pixel PXL is disposed on an i-th row and a j-th column of the display unit 110 (refer to FIG. 3), the pixel circuit PXC of the pixel PXL may be connected to an i-th switching scan line SWL and a j-th control line CL.

The switching circuit SWC may open some of the series sets SET1 to SET4 or select series sets SET1 to SET4 that validly emit light in the emission component EMU. The switching circuit SWC may be connected in parallel to some of the series sets SET1 to SET4, and may be connected in series to remaining some of the series sets SET1 to SET4. In the case where the switching circuit SWC opens some of the series sets SET1 to SET4, driving current flows through only remaining some of the series sets SET1 to SET4, and only the light emitting elements LD that are included in the remaining some of the series sets SET1 to SET4 may emit light.

In one or more embodiments, the switching circuit SWC may include a fourth transistor T4. Furthermore, the switching circuit SWC may optionally further include a fifth transistor T5 and a second storage capacitor CST2.

The fourth transistor T4 (or a first switching transistor) may be connected between the first intermediate electrode CTE1 and the second power line PL2 (or the second contact electrode CNE2). A first terminal of the fourth transistor T4 may be connected to the first intermediate electrode CTE1. A second terminal of the fourth transistor T4 may be connected to the second power line PL2 (or the second contact electrode CNE2). A gate electrode of the fourth transistor T4 may be connected to a third node N3.

When a mode signal VSW having a gate-off voltage is supplied from the control line CL to the third node N3, the fourth transistor T4 may be turned off so that the first intermediate electrode CTE1 and the second power line PL2 (or the second contact electrode CNE2) can be electrically separated from each other. In this case, driving current applied to the emission component EMU may flow through the first, second, third, and fourth light emitting elements LD1, LD2, LD3, and LD4 (or the first, second, third, and fourth series sets SET1, SET2, SET3, and SET4). In other words, the first, second, third, and fourth light emitting elements LD1, LD2, LD3, and LD4 (or the first, second, third, and fourth series sets SET1, SET2, SET3, and SET4) may validly emit light.

On the other hand, when a mode signal VSW having a gate-on voltage is supplied from the control line CL to the third node N3, the fourth transistor T4 may be turned on so that the first intermediate electrode CTE1 and the second power line PL2 (or the second contact electrode CNE2) can be electrically connected to each other. In this case, driving current applied to the emission component EMU may flow through the first contact electrode CNE1, the first light emitting element LD1 (or the first series set SET1), and the second power line PL2 (or the second contact electrode CNE2), and may not flow to the second, third, and fourth light emitting elements LD2, LD3, and LD4 (or the second, third, and fourth series sets SET2, SET3, and SET4). In other words, the second, third, and fourth light emitting elements LD2, LD3, and LD4 (or the second, third, and fourth series sets SET2, SET3, and SET4) may be open, and only the first light emitting element LD1 (or the first series set SET1) may validly emit light.

Compared to the pixel PXL in which the first, second, third, and fourth light emitting elements LD1, LD2, LD3, and LD4 validly emit light, the luminance of a pixel PXL in which only the first light emitting element LD1 emits light based on the same driving current may be relatively low. Therefore, in the case where only the first light emitting element LD1 emits light, the driving current may be set to a relatively high value. Hence, a shift of a wavelength band which may occur when the light emitting element LD is driven with relatively low driving current may be prevented from being caused.

The fifth transistor (or a second switching transistor) T5 may be connected between the control line CL and the third node N3. A first terminal of the fifth transistor T5 may be connected to the control line CL. A second terminal of the fifth transistor T5 may be connected to the third node N3. A gate electrode of the fifth transistor T5 may be connected to the switching scan line SWL. The first terminal and the second terminal of the fifth transistor T5 are different terminals, and, for example, if the first terminal is a drain electrode, and the second terminal may be a source electrode.

When a switching scan signal SSW having a gate-on voltage is supplied from the switching scan line SWL, the fifth transistor T5 may be turned on so that the control line CL and the third node N3 can be electrically connected to each other. The third node N3 may be a point at which the second terminal of the fifth transistor T5 and the gate electrode of the fourth transistor T4 are connected to each other. The fifth transistor T5 may transmit a mode signal VSW to the gate electrode of the fourth transistor T4.

The switching scan line SWL may be different from the scan line SCL, but it is not limited thereto. For example, the switching scan line SWL may be the same as the scan line SCL. The switching scan signal SSW of the switching scan line SWL may be the same as the scan signal SC of the scan line SCL.

The second storage capacitor CST2 (or a hold capacitor) may be formed or electrically connected between the third node N3 and the second terminal of the fourth transistor T4. The second storage capacitor CST2 may include a first capacitor electrode (or a first electrode) and a second capacitor electrode (or a second electrode). The first capacitor electrode of the second storage capacitor CST2 may be electrically connected to the third node N3. The second capacitor electrode of the second storage capacitor CST2 may be electrically connected to the second terminal of the fourth transistor T4. The second storage capacitor CST2 may be charged with a voltage corresponding to a mode signal VSW to be supplied to the third node N3 during each frame period.

As described above, the pixel PXL may further include the switching circuit SWC. The switching circuit SWC may open some of the series sets SET1 to SET4 adjust or reduce the number of light emitting elements LD that validly emit light in the emission component EMU. The light emitting elements LD the number of which is relatively reduced may emit light based on relatively high driving current, so that the wavelength band may be prevented from shifting attributable to relatively low driving current, and the low-grayscale image representation performance of the display device 100 (refer to FIG. 3) including the pixel PXL can be enhanced.

Although FIG. 5 illustrates the case where all of the transistors T1 to T5 included in the pixel circuit PXC are formed of n-type transistors, the present disclosure is not certainly limited thereto. For example, at least one of the transistors T1 to T5 may be changed to a p-type transistor.

The structure and driving scheme of the pixel PXL may be changed in various ways. For instance, the pixel circuit PXC may not only be formed of the pixel circuit of the embodiment illustrated in FIG. 5 but may also be formed of a pixel circuit which may have various structures and/or be operated in various driving schemes.

For example, the pixel circuit PXC may not include the third transistor T3. Furthermore, the pixel circuit PXC may further include other circuit elements such as a compensation transistor configured to compensate for the threshold voltage of the first transistor T1, an initialization transistor configured to initialize the voltage of the first node N1 and/or the first contact electrode CNE1, an emission control transistor configured to control a period during which driving current is supplied to the emission component EMU, and/or a boosting capacitor configured to boost the voltage of the first node N1.

Although FIG. 5 illustrates that the switching circuit SWC is connected to the first intermediate electrode CTE1, the present disclosure is not limited thereto. Other connection configurations between the switching circuit SWC and the intermediate electrodes CTE1 to CTE3 will be described below with reference to FIGS. 10 to 18.

Figure 6:
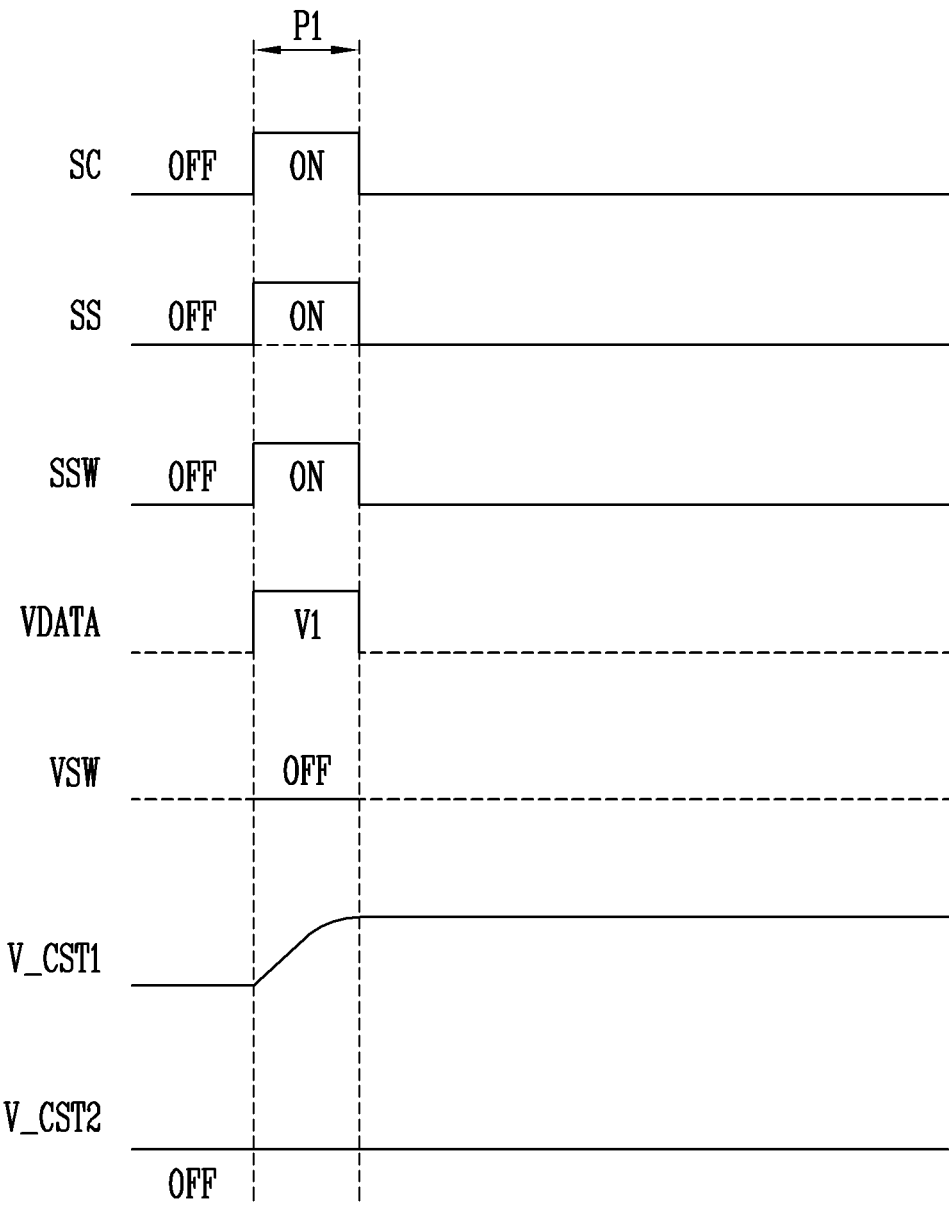
FIG. 6 is a waveform diagram for describing a first operation of the pixel of FIG. 5.
Figure 7:
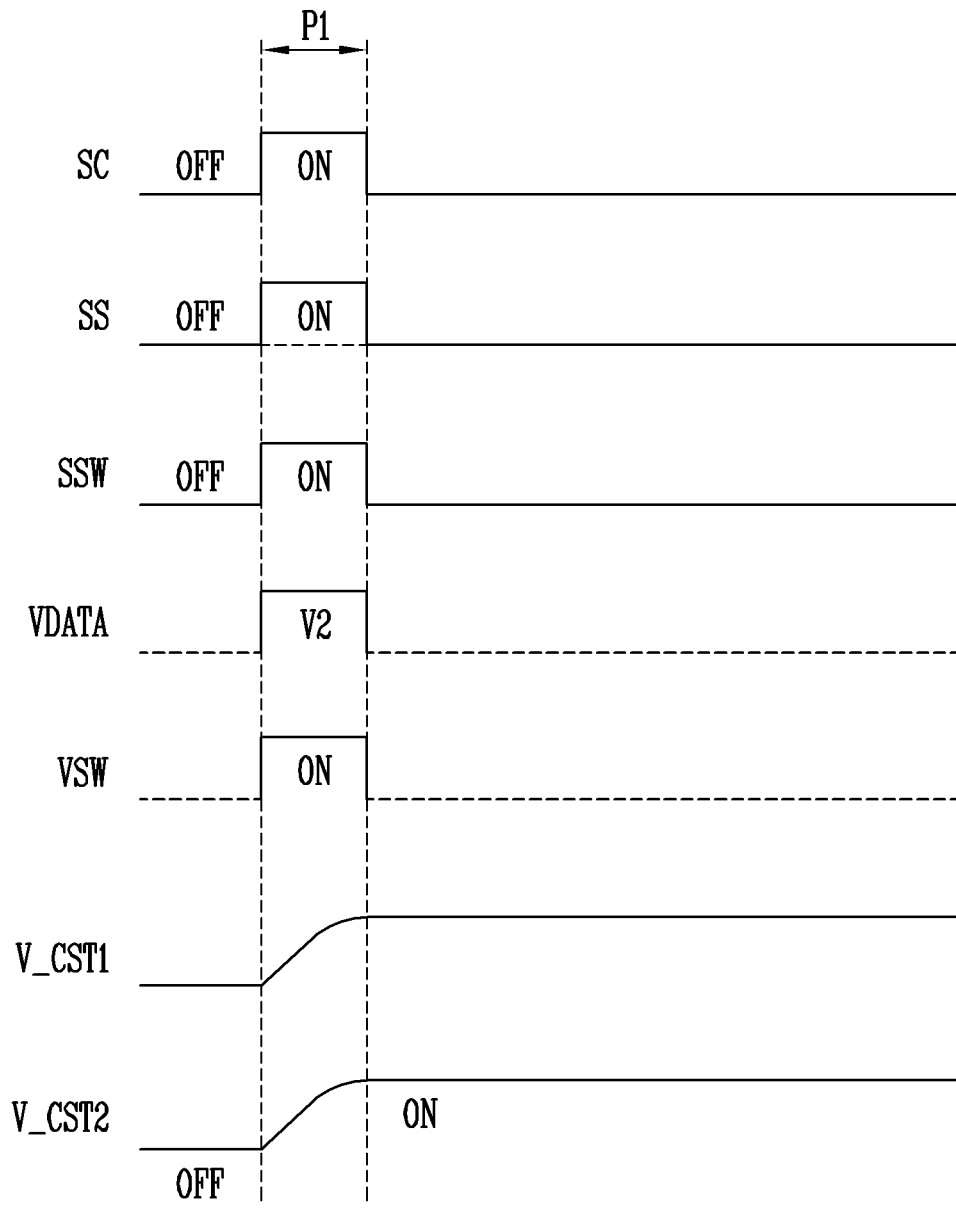
FIG. 7 is a waveform diagram for describing a second operation of the pixel of FIG. 5.

FIG. 6 is a waveform diagram for describing a first operation of the pixel of FIG. 5. FIG. 7 is a waveform diagram for describing a second operation of the pixel of FIG. 5.

Referring to FIGS. 3 to 7, in the case where a grayscale value for the pixel PXL is greater than or identical to the reference grayscale value, the pixel PXL may be operated in a first case (or a first mode) of FIG. 6. Alternatively, in the case where a grayscale value for the pixel PXL is less than the reference grayscale value, the pixel PXL may be operated in a second case (or a second mode) of FIG. 7.

In a first period P1, the scan signal SC may have a gate-on voltage ON, and the data signal VDATA may have a voltage corresponding to a grayscale value for the pixel PXL. For example, when the grayscale value is a high grayscale value, the data signal VDATA may have a first voltage V1 (refer to FIG. 6). In the case where the grayscale value is a low grayscale value, the data signal VDATA may have a second voltage V2 (refer to FIG. 7). The second voltage V2 may be less than the first voltage V1, but the present disclosure is not limited thereto. In one or more embodiments, a range of the second voltage V2 may be identical or similar to a range of the first voltage V1.

The first period P1 may be a period allocated to write the data signal VDATA to the pixel PXL in a single frame. The first period P1 may be a non-emission period. Except the first period P1, a remaining period (i.e., the other period of the frame, particularly, the other period after the first period P1) may be an emission period.

The second transistor T2 may be turned on in response to the scan signal SC having a gate-on voltage ON. The data signal VDATA may be applied from the data line DL to the gate electrode of the first transistor T1. The data signal VDATA (or a voltage corresponding thereto) may be stored in the first storage capacitor CST1. In the first period P1, a voltage V_CST1 charged to the first storage capacitor CST1 may be changed depending on the data signal VDATA.

During the first period P1, the sensing scan signal SS may have a gate-on voltage ON or a gate-off voltage OFF.

During the first period P1, the switching scan signal SSW may have a gate-on voltage ON. The fifth transistor T5 may be turned on in response to the switching scan signal SSW having a gate-on voltage ON. The mode signal VSW may be applied from the control line CL to the gate electrode of the fourth transistor T4. The mode signal VSW (or a voltage corresponding thereto) may be stored in the second storage capacitor CST2.

In the case where the grayscale value for the pixel PXL is greater than or identical to the reference grayscale value, as shown in FIG. 6, the mode signal VSW may have a gate-off voltage OFF, and a voltage V_CST2 charged to the second storage capacitor CST2 may have a gate-off voltage OFF or remain at the gate-off voltage OFF. In this case, in response to the gate-off voltage OFF, the fourth transistor T4 may be turned off, and all of the first, second, third, and fourth light emitting elements LD1, LD2, LD3, and LD4 of the emission component EMU may be connected in series between the first contact electrode CNE1 and the second contact electrode CNE2. In the emission period (e.g., in the period after the first period P1), the pixel PXL may use the four series sets SET1 to SET4 to emit light at a luminance corresponding to the first voltage V1.

In the case where the grayscale value for the pixel PXL is less than the reference grayscale value, as shown in FIG. 7, the mode signal VSW may have a gate-on voltage ON, and the voltage V_CST2 charged to the second storage capacitor CST2 may be changed to have a gate-on voltage ON or remain at the gate-on voltage ON. In this case, in response to the gate-on voltage ON, the fourth transistor T4 may be turned on, the first intermediate electrode CTE1 and the second power line PL2 (or the second contact electrode CNE2) may be connected, and only the first light emitting element LD1 of the emission component EMU may be connected between the first contact electrode CNE1 and the second contact electrode CNE2. In the emission period (e.g., in the period after the first period P1), the pixel PXL may use only the first series set SET1 to emit light at a luminance corresponding to the second voltage V2.

Figure 8:
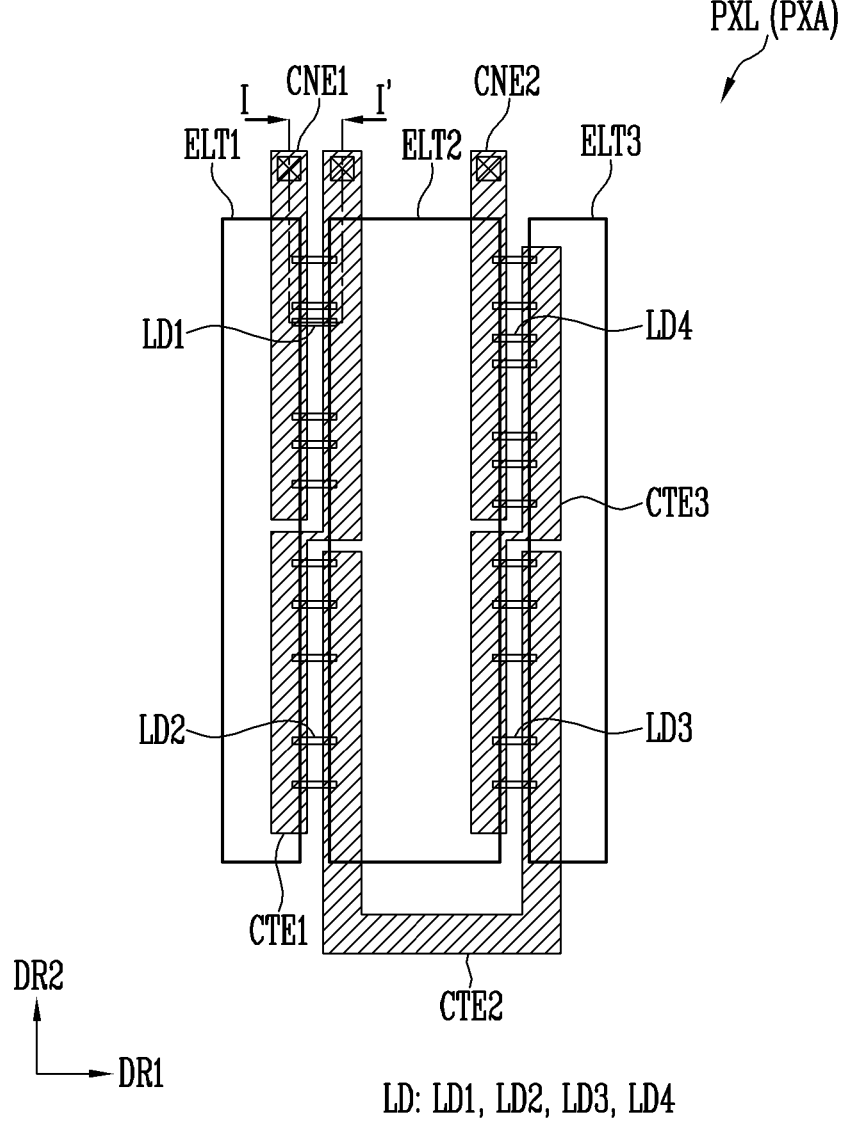
FIG. 8 is a plan view illustrating an embodiment of the pixel of FIG. 5.

FIG. 8 is a plan view illustrating an embodiment of the pixel PXL of FIG. 5. FIG. 8 simply illustrates the pixel PXL of FIG. 5 based on the emission component EMU (refer to FIG. 5).

Referring to FIGS. 5 and 8, the pixel PXL may include electrodes ELT1 to ELT3 (or alignment electrodes), the light emitting elements LD, the first and second contact electrodes CNE1 and CNE2, and the intermediate electrodes CTE1 to CTE3. The electrodes ELT1 to ELT3 may include a first electrode ELT1, a second electrode ELT2, and a third electrode ELT3, but the present disclosure is not limited thereto.

Each of the electrodes ELT1 to ELT3 may extend in a second direction DR2. The electrodes ELT1 to ELT3 may be spaced from each other in a first direction DR1. The second electrode ELT2 may be spaced from the first electrode ELT1 in the first direction DR1. The third electrode ELT3 may be spaced from the second electrode ELT2 in the first direction DR1.

The electrodes ELT1 to ELT3 may be used as alignment electrodes in such a way that, after a mixed solution (e.g., ink) including light emitting elements LD are inputted to the pixel area PXA (or the emission area), alignment voltages are applied to the electrodes ELT1 to ELT3. The first electrode ELT1 may be a first alignment electrode. The second electrode ELT2 may be a second alignment electrode. The third electrode ELT3 may be a third alignment electrode. Here, the first light emitting element LD1 and the second light emitting element LD2 may be aligned in a desired direction and/or at desired positions by an electric field formed between the first alignment electrode ELT1 and the second alignment electrode ELT2. Likewise, the third light emitting element LD3 and the fourth light emitting element LD4 may be aligned in a desired direction and/or at desired positions by an electric field formed between the second alignment electrode ELT2 and the third alignment electrode ELT3. In one or more embodiments, the electrodes ELT1 to ELT3 may be used as driving electrodes for driving the light emitting elements LD after the light emitting elements LD have been aligned. In this case, one of the electrodes ELT1 to ELT3 may form an anode of the emission component EMU, and another one of the electrodes ELT1 to ELT3 may form a cathode of the emission component EMU. For example, the first electrode ELT1 may form an anode of the emission component EMU, and may be connected to the first transistor T1 of FIG. 5 through a contact hole or the like. For example, the second electrode ELT2 may form a cathode of the emission component EMU, and may be connected to the second power line PL2 of FIG. 5 through a contact hole or the like.

In a plan view, the electrodes ELT1 to ELT3 may have a bar shape extending in the second direction DR2, but the present disclosure is not limited thereto. In other words, the shape of each of the electrodes ELT1 to ELT3 may be changed in various ways.

The light emitting elements LD may be disposed between adjacent electrodes from among the electrodes ELT1 to ELT3 such that the longitudinal direction (L, refer to FIG. 1) of each light emitting element LD is substantially parallel to the first direction DR1. For example, the first light emitting element LD1 and the second light emitting element LD2 may be disposed between the first electrode ELT1 and the second electrode ELT2. The third light emitting element LD3 and the fourth light emitting element LD4 may be disposed between the second electrode ELT2 and the third electrode ELT3.

The first contact electrode CNE1 may be disposed to overlap the first end of each of the first light emitting elements LD1 and the first electrode ELT1. In one or more embodiments, the first contact electrode CNE1 may physically and/or electrically connect the first end of the first light emitting element LD1 with the first electrode ELT1. However, the present disclosure is not limited thereto. For example, the first contact electrode CNE1 may be electrically separated from the first electrode ELT1. The first contact electrode CNE1 may form an anode of the emission component EMU (refer to FIG. 5), and may be connected to the first transistor T1 of FIG. 5 through a contact hole or the like. The first contact electrode CNE1 may extend in the second direction DR2 as the first electrode ELT1.

The first intermediate electrode CTE1 may be disposed to overlap the second end of the first light emitting element LD1 and the second electrode ELT2. The first intermediate electrode CTE1 may be disposed to overlap the first end of the second light emitting element LD2 and the first electrode ELT1. To this end, a portion of the first intermediate electrode CTE1 may have a curved shape. The first intermediate electrode CTE1 may physically and/or electrically connect the second end of the first light emitting element LD1 to the first end of the second light emitting element LD2.

In one or more embodiments, the first intermediate electrode CTE1 may be connected to the fourth transistor T4 of FIG. 5 through a contact hole or the like.

The second intermediate electrode CTE2 may be disposed to overlap the second end of the second light emitting element LD2 and the second electrode ELT2. Furthermore, the second intermediate electrode CTE2 may be disposed to overlap the first end of the third light emitting element LD3 and the third electrode ELT3. The second intermediate electrode CTE2 may have a shape detouring around the third intermediate electrode CTE3. The second intermediate electrode CTE2 may physically and/or electrically connect the second end of the second light emitting element LD2 to the first end of the third light emitting element LD3.

The third intermediate electrode CTE3 may be disposed to overlap the second end of the third light emitting element LD3 and the second electrode ELT2. Furthermore, the third intermediate electrode CTE3 may be disposed to overlap the first end of the fourth light emitting element LD4 and the third electrode ELT3. To this end, a portion of the third intermediate electrode CTE3 may have a curved shape. The third intermediate electrode CTE3 may physically and/or electrically connect the second end of the third light emitting element LD3 to the first end of the fourth light emitting element LD4.

The second contact electrode CNE2 may be disposed to overlap the second end of each of the fourth light emitting elements LD4 and the second electrode ELT2. In one or more embodiments, the second contact electrode CNE2 may physically and/or electrically connect the second end of the fourth light emitting element LD4 with the second electrode ELT2. However, the present disclosure is not limited thereto. For example, the second contact electrode CNE2 may be electrically separated from the second electrode ELT2. The second contact electrode CNE2 may form a cathode of the emission component EMU (refer to FIG. 5), and may be connected to the second power line PL2 of FIG. 5 through a contact hole or the like. The second contact electrode CNE2 may extend in the second direction DR2 as the second electrode ELT2.

The shape of each of the first and second contact electrodes CNE1 and CNE2 and the intermediate electrodes CTE1 to CTE3 may be changed in various ways within a range capable of being reliably electrically connected with the corresponding light emitting elements LD.

Figure 9:
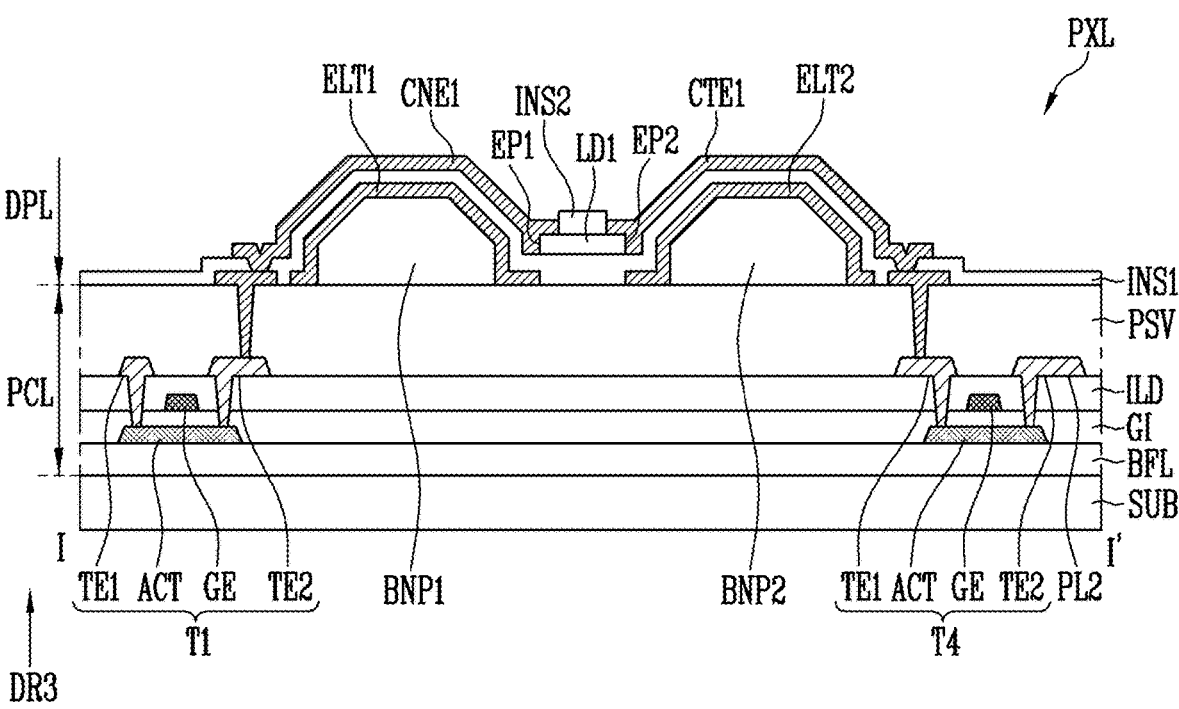
FIG. 9 is a sectional view illustrating an embodiment of the pixel taken along the line I-I' of FIG. 8.

FIG. 9 is a sectional view illustrating an embodiment of the pixel PXL taken along the line I-I' of FIG. 8.

Although FIG. 9 simply illustrates the pixel PXL, e.g., illustrating that each electrode is formed of a single electrode and each insulating layer is formed of a single insulating layer, the present disclosure is not limited thereto. In addition, in one or more embodiments of the present disclosure, the term "connection" between two components may embrace electrical connection and physical connection.

Referring to FIGS. 5, 8, and 9, the pixel PXL may include a pixel circuit layer PCL and a display element layer DPL that are disposed on a substrate SUB.

The substrate SUB may form a base and may be formed of a rigid or flexible substrate or film. For example, the substrate SUB may be a rigid substrate made of glass or reinforced glass, a flexible substrate (or a thin film) formed of plastic or metal, or at least one insulating layer.

The pixel circuit layer PCL may include the first transistor T1, the fourth transistor T4, and the second power line PL2. In addition, the pixel circuit layer PCL may include a plurality of insulating layers BFL, GI, ILD, and PSV. Each of the first transistor T1 and the fourth transistor T4 may include a semiconductor pattern ACT, a gate electrode GE, and first and second transistor electrodes TE1 and TE2 (or first and second terminals).

A buffer layer BFL may be disposed on the substrate SUB. The buffer layer BFL may prevent impurities from diffusing into a circuit element. The buffer layer BFL may be formed of a single layer, or may be formed of multiple layers having at least two or more layers. In case that the buffer layer BFL has a multilayer structure, the respective layers may be formed of the same material or different materials.

A semiconductor pattern ACT may be disposed on the buffer layer BFL. For example, the semiconductor pattern ACT may include a first area that contacts a first transistor electrode TE1, a second area that contacts a second transistor electrode TE2, and a channel area disposed between the first and second areas. In one or more embodiments, one of the first and second areas may be a source area, and the other one may be a drain area.

In one or more embodiments, the semiconductor pattern ACT may be formed of polysilicon, amorphous silicon, an oxide semiconductor, etc. The channel area of the semiconductor pattern ACT may be an intrinsic semiconductor, which is an undoped semiconductor pattern. Each of the first and second areas of the semiconductor pattern ACT may be a semiconductor doped with a dopant.

A gate insulating layer GI may be disposed on the semiconductor pattern ACT and the buffer layer BFL. For example, the gate insulating layer GI may be disposed between the semiconductor pattern ACT and the gate electrode GE. The gate insulating layer GI may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE may be disposed on the gate insulating layer GI. The gate electrode GE may overlap the semiconductor pattern ACT in a third direction DR3 (e.g., a thickness direction of the substrate SUB).

Each gate electrode GE may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof. For example, the gate electrode GE may have a multilayer structure formed by successively or repeatedly stacking titanium (Ti), copper (Cu), and/or indium tin oxide (ITO).

An interlayer insulating layer ILD may be disposed on the gate electrode GE and the gate insulating layer GI. For example, the interlayer insulating layer ILD may be disposed between the gate electrode GE and the first and second transistor electrodes TE1 and TE2.

The interlayer insulating layer ILD may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 and/or the second power line PL2 may be disposed on the interlayer insulating layer ILD. The first and second transistor electrodes TE1 and TE2 and the second power line PL2 may be disposed on (or at) the same layer. For example, the first and second transistor electrodes TE1 and TE2 and the second power line PL2 may be concurrently (e.g., simultaneously) formed through the same process, but the present disclosure is not limited thereto.

The first and second transistor electrodes TE1 and TE2 may overlap the semiconductor pattern ACT in the third direction DR3. The first and second transistor electrodes TE1 and TE2 may be electrically connected to the semiconductor pattern ACT. For example, the first transistor electrode TE1 may be electrically connected with the first area of the semiconductor pattern ACT through a contact hole passing through the interlayer insulating layer ILD and the gate insulating layer GI. The second transistor electrode TE2 may be electrically connected with the second area of the semiconductor pattern ACT through a contact hole passing through the interlayer insulating layer ILD and the gate insulating layer GI. In one or more embodiments, any one of the first and second transistor electrodes TE1 and TE2 may be a source electrode, and the other one may be a drain electrode.

The first and second transistor electrodes TE1 and TE2 and the second power line PL2 each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A passivation layer PSV (or a via layer) may be disposed on the first and second transistor electrodes TE1 and TE2 and the second power line PL2.

The passivation layer PSV may be formed of organic material for planarizing a stepped structure provided therebelow. For example, the passivation layer PSV may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The passivation layer PSV may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). Alternatively, an insulating layer including the inorganic material may be disposed between the passivation layer PSV including organic material and the first and second transistor electrodes TE1 and TE2.

The display element layer DPL may be disposed on the passivation layer PSV. The display element layer DPL may include first and second bank patterns BNP1 and BNP2, the first and second electrodes ELT1 and ELT2, a first insulating layer INS1, the first light emitting element LD1 (or the light emitting element), a second insulating layer INS2 (or a second insulating pattern), the first contact electrode CNE1, and the first intermediate electrode CTE1.

The first and second bank patterns BNP1 and BNP2 may function to form a certain stepped structure to allow the first light emitting element LD1 to be easily aligned. Furthermore, the first and second bank patterns BNP1 and BNP2 may support the first and second electrodes ELT1 and ELT2 to change surface profiles (or shapes) of the first and second electrodes ELT1 and ELT2 so that light emitted from the first light emitting element LD1 can be guided in an image display direction (e.g., in the third direction DR3) of the display device.

Each of the first and second bank patterns BNP1 and BNP2 may have various shapes depending on embodiments. In one or more embodiments, each of the first and second bank patterns BNP1 and BNP2 may have a shape protruding in the third direction DR3 on the substrate SUB. Furthermore, each of the first and second bank patterns BNP1 and BNP2 may have an inclined surface angled to the substrate SUB at a suitable angle (e.g., a predetermined angle). However, the present disclosure is not limited thereto. Each of the first and second bank patterns BNP1 and BNP2 may have a sidewall having a curved shape, a stepped shape, or the like. For example, each of the first and second bank patterns BNP1 and BNP2 may have a semi-circular or semi-elliptical cross-section.

Each of the first and second bank patterns BNP1 and BNP2 may include at least one organic material and/or inorganic material. For example, each of the first and second bank patterns BNP1 and BNP2 may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. Each of the first and second bank patterns BNP1 and BNP2 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second electrodes ELT1 and ELT2 may be disposed on the passivation layer PSV and the first and second bank patterns BNP1 and BNP2. For example, the first electrode ELT1 may be disposed on the first bank pattern BNP1, and the second electrode ELT2 may be disposed on the second bank pattern BNP2.

The first and second electrodes ELT1 and ELT2 may at least partially cover side surfaces and/or upper surfaces of the first and second bank patterns BNP1 and BNP2. The first and second electrodes ELT1 and ELT2 may respectively have shapes corresponding to the first and second bank patterns BNP1 and BNP2. For example, the first and second electrodes ELT1 and ELT2 may include inclined surfaces or curved surfaces having shapes corresponding to the shapes of the first and second bank patterns BNP1 and BNP2. In this case, the first and second electrodes ELT1 and ELT2 and the first and second bank patterns BNP1 and BNP2 may function as reflectors to reflect light emitted from the first light emitting element LD1 and guide the light in the frontal direction of the pixel PXL, i.e., in the third direction DR3, so that the light output efficiency of the display device can be enhanced.

Each of the first and second electrodes ELT1 and ELT2 may include at least one conductive material. For example, the electrodes ELT1 to ELT3 may include at least one conductive material from among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as poly(3,4-ethylenedioxythiophene) (PEDOT), but the present disclosure is not limited thereto.

The first insulating layer INS1 may be disposed on the first and second electrode ELT1 and ELT2. The first insulating layer INS1 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first light emitting element LD1 may be disposed on the first insulating layer INS1. The first light emitting element LD1 may be disposed between the first and second bank patterns BNP1 and the BNP2 and/or between the first and second electrodes ELT1 and ELT2. In one or more embodiments, the first light emitting element LD1 may partially overlap the first and second electrodes ELT1 and ELT2 in the third direction DR3.

The first light emitting element LD1 may be prepared in a diffused form in light-emitting-element ink, and then supplied to the pixel PXL by an inkjet printing scheme or the like. For example, the first light emitting element LD1 may be diffused in a volatile solvent and supplied to the pixel PXL. Thereafter, as described above, if alignment signals are supplied to the first and second electrodes ELT1 and ELT2, an electric field may be formed between the first and second electrodes ELT1 and ELT2, so that the first light emitting element LD1 can be aligned between the first and second electrodes ELT1 and ELT2. After the first light emitting element LD1 have been aligned, the solvent may be removed by a volatilization scheme or other schemes. In this way, the first light emitting element LD1 may be reliably arranged.

The second insulating layer INS2 may be disposed on the first light emitting element LD1. For example, the second insulating layer INS2 may be partially provided on the first light emitting element LD1 so that the first and second ends EP1 and EP2 of the first light emitting element LD1 are exposed from the second insulating layer INS2. In the case where the second insulating layer INS2 is formed on the first light emitting element LD1 after the alignment of the first light emitting element LD1 have been completed, the first light emitting element LD1 can be prevented from being removed from the aligned positions. In one or more embodiments, the second insulating layer INS2 may be omitted.

The second insulating layer INS2 may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The second insulating layer INS2 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first contact electrode CNE1 and the first intermediate electrode CTE1 may be disposed on the first and second ends EP1 and EP2 of the first light emitting element LD1 that are exposed from the second insulating layer INS2.

The first contact electrode CNE1 may be directly disposed on the first end EP1 of the first light emitting element LD1 and contact the first end EP1 of the first light emitting element LD1. The first contact electrode CNE1 may be electrically connected to the second transistor electrode TE2 of the first transistor T1 through a contact hole or the like that passes through the passivation layer PSV.

The first intermediate electrode CTE1 may be directly disposed on the second end EP2 of the first light emitting element LD1 and contact the second end EP2 of the first light emitting element LD1. The first intermediate electrode CTE1 may be electrically connected to the first transistor electrode TE1 of the fourth transistor T4 through a contact hole or the like that passes through the passivation layer PSV.

The first contact electrode CNE1 and the first intermediate electrode CTE1 may be formed of various transparent conductive materials. Hence, light emitted from the first and second ends EP1 and EP2 of the first light emitting element LD1 may be emitted outward in the third direction DR3 through the first contact electrode CNE1 and the first intermediate electrode CTE1. The transparent conductive material may include transparent conductive oxides such as indium tin oxide (ITO), indium zinc oxide (IZO), zinc oxide (ZnOx), indium gallium zinc oxide (IGZO), and indium tin zinc oxide (ITZO), and a conductive polymer such as poly(3,4-ethylenedioxythiophene) (PEDOT).

In one or more embodiments, the first contact electrode CNE1 and the first intermediate electrode CTE1 may be formed of the same conductive layer. In one or more embodiments, the first contact electrode CNE1 and the first intermediate electrode CTE1 may be concurrently (e.g., simultaneously) formed through the same process. In this case, the number of masks may be reduced, and a fabrication process may be simplified. However, the present disclosure is not limited thereto. The first contact electrode CNE1 and the first intermediate electrode CTE1 may be formed of different conductive layers with an insulating layer interposed therebetween.

In one or more embodiments, an overcoat layer may be disposed on the first contact electrode CNE1 and the first intermediate electrode CTE1. The overcoat layer may be formed of an inorganic insulating layer including inorganic material or an organic insulating layer including organic material. For example, the overcoat layer may have a structure formed by alternately stacking at least one inorganic insulating layer and at least one organic insulating layer. The overcoat layer may cover the entirety of the display element layer DPL and prevent water or moisture from being drawn into the display element layer DPL including the first light emitting element LD1 from the outside. The overcoat layer may planarize an upper surface of the display element layer DPL.

In one or more embodiments, the display element layer DPL may optionally further include an optical layer. The optical layer may further be disposed on the display element layer DPL. For example, the display element layer DPL may further include a color conversion layer including color conversion particles for converting the color of light emitted from the first light emitting element LD1 to a specific color of light. Furthermore, the display element layer DPL may further include a color filter configured to allow light of only a specific wavelength band to pass therethrough.

FIGS. 10 to 14 are circuit diagrams each illustrating an embodiment of the pixel PXL included in the display device of FIG. 3.

Referring to FIGS. 3 to 5, and 10 to 14, pixels PXL_1 to PXL_5 of FIGS. 10 to 14 other than connection configuration of the fourth transistor T4 may be substantially identical or similar to the pixel PXL of FIG. 5. Therefore, repetitive explanation thereof will be omitted.

Figure 10:
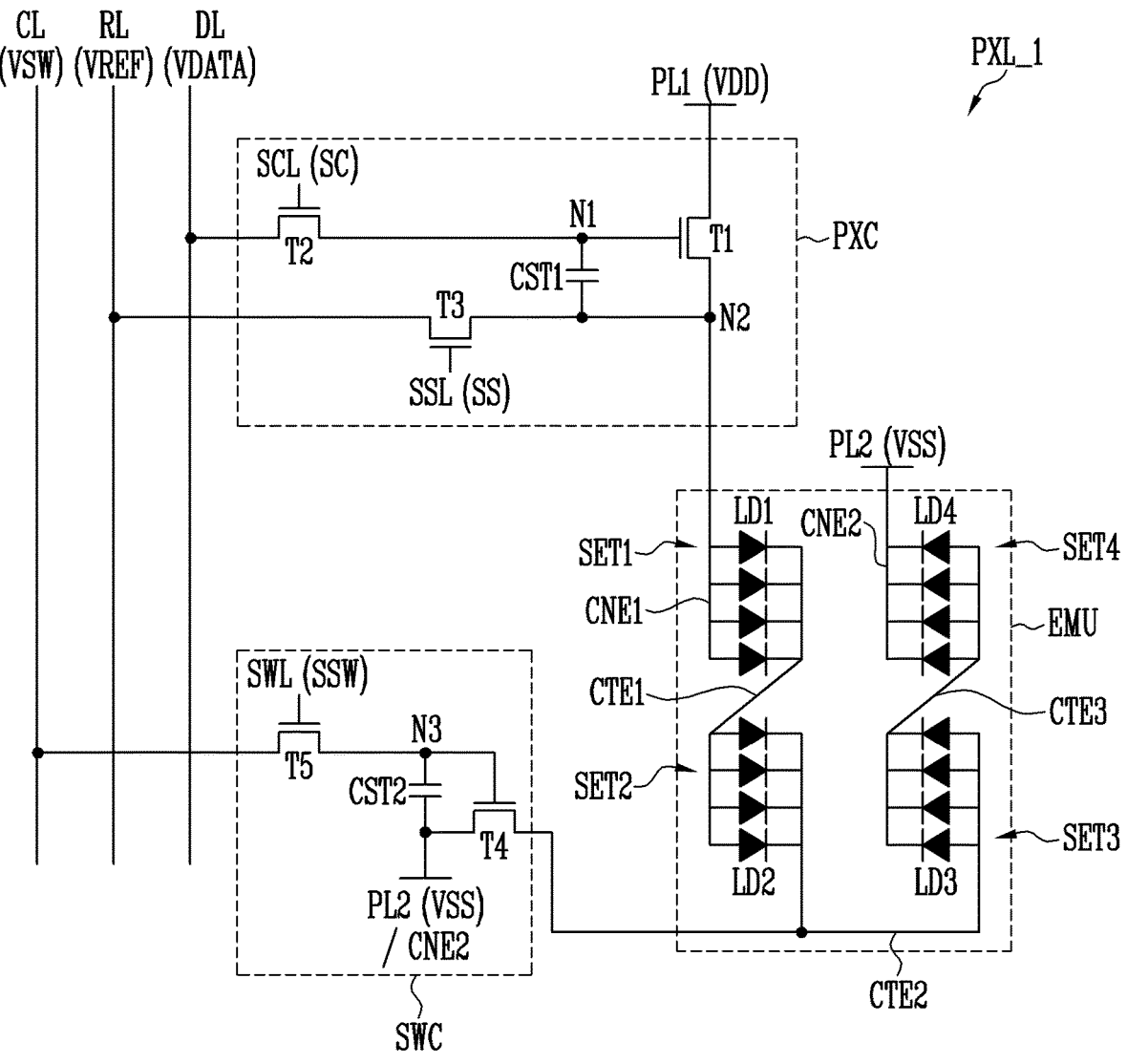
FIGS. 10 to 14 are circuit diagrams each illustrating an embodiment of the pixel included in the display device of FIG. 3.

As illustrated in FIG. 10, the fourth transistor T4 of the pixel PXL_1 may be connected between the second intermediate electrode CTE2 and the second power line PL2 (or the second contact electrode CNE2). The first terminal of the fourth transistor T4 may be connected to the second intermediate electrode CTE2. When a mode signal VSW having a gate-on voltage is supplied from the control line CL to the third node N3, the fourth transistor T4 may be turned on so that the second intermediate electrode CTE2 and the second power line PL2 (or the second contact electrode CNE2) can be electrically connected to each other. In this case, driving current applied to the emission component EMU may flow through the first contact electrode CNE1, the first and second light emitting elements LD1 and LD2 (or the first and second series sets SET1 and SET2), and the second power line PL2 (or the second contact electrode CNE2), and may not flow to the third and fourth light emitting elements LD3 and LD4 (or the third and fourth series sets SET3 and SET4). In other words, the third and fourth light emitting elements LD3 and LD4 (or the third and fourth series sets SET3 and SET4) may be open, and only the first and second light emitting elements LD1 and LD2 (or the first and second series sets SET1 and SET2) may validly emit light.

Figure 11:
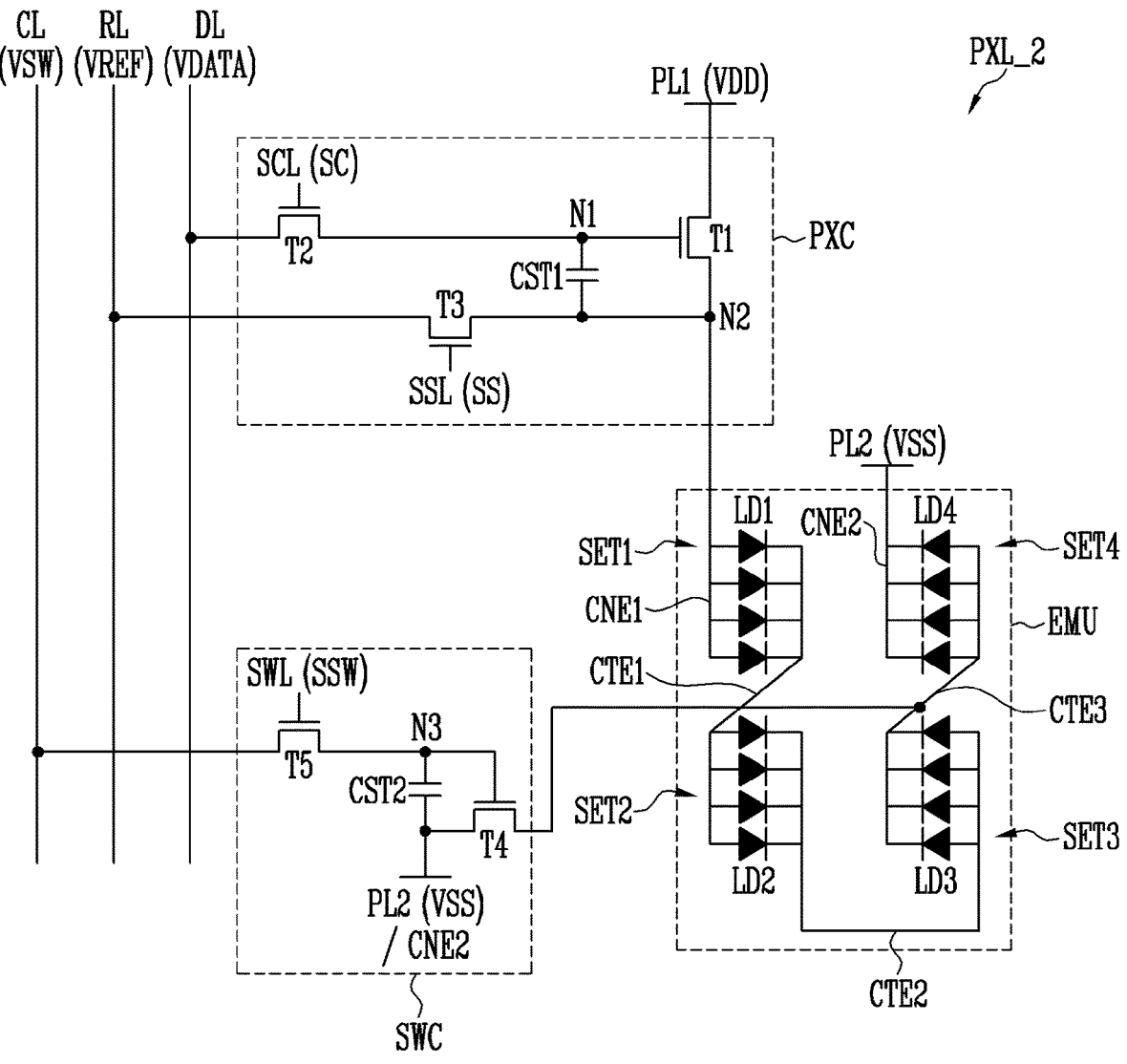

As illustrated in FIG. 11, the fourth transistor T4 of the pixel PXL_2 may be connected between the third intermediate electrode CTE3 and the second power line PL2 (or the second contact electrode CNE2). The first terminal of the fourth transistor T4 may be connected to the third intermediate electrode CTE3. When a mode signal VSW having a gate-on voltage is supplied from the control line CL to the third node N3, the fourth transistor T4 may be turned on so that the third intermediate electrode CTE3 and the second power line PL2 (or the second contact electrode CNE2) can be electrically connected to each other. In this case, only the first, second, and third light emitting elements LD1, LD2, and LD3 (or the first, second, and third series sets SET1, SET2, and SET3) may emit light, and the fourth light emitting element LD4 (or the fourth series set SET4) may not emit light.

Figure 12:
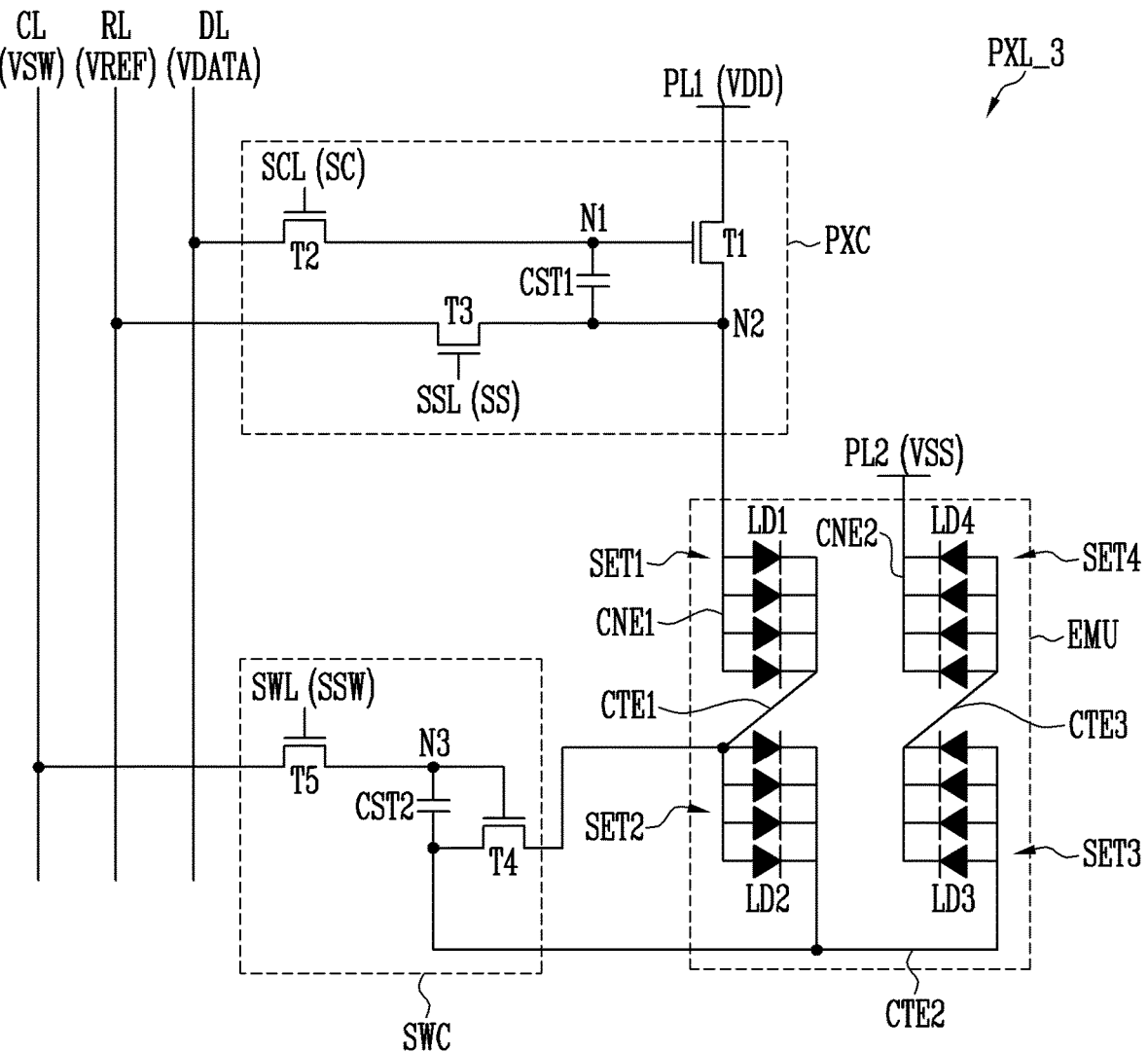

As illustrated in FIG. 12, the fourth transistor T4 of the pixel PXL_3 may be connected between the first intermediate electrode CTE1 and the second intermediate electrode CTE2. The first terminal of the fourth transistor T4 may be connected to the first intermediate electrode CTE1. The second terminal of the fourth transistor T4 may be connected to the second intermediate electrode CTE2. When a mode signal VSW having a gate-on voltage is supplied from the control line CL to the third node N3, the fourth transistor T4 may be turned on so that the first intermediate electrode CTE1 and the second intermediate electrode CTE2 can be electrically connected to each other. In this case, only the first, third, and fourth light emitting elements LD1, LD3, and LD4 (or the first, third, and fourth series sets SET1, SET3, and SET4) may emit light, and the second light emitting element LD2 (or the second series set SET2) may not emit light.

Figure 13:
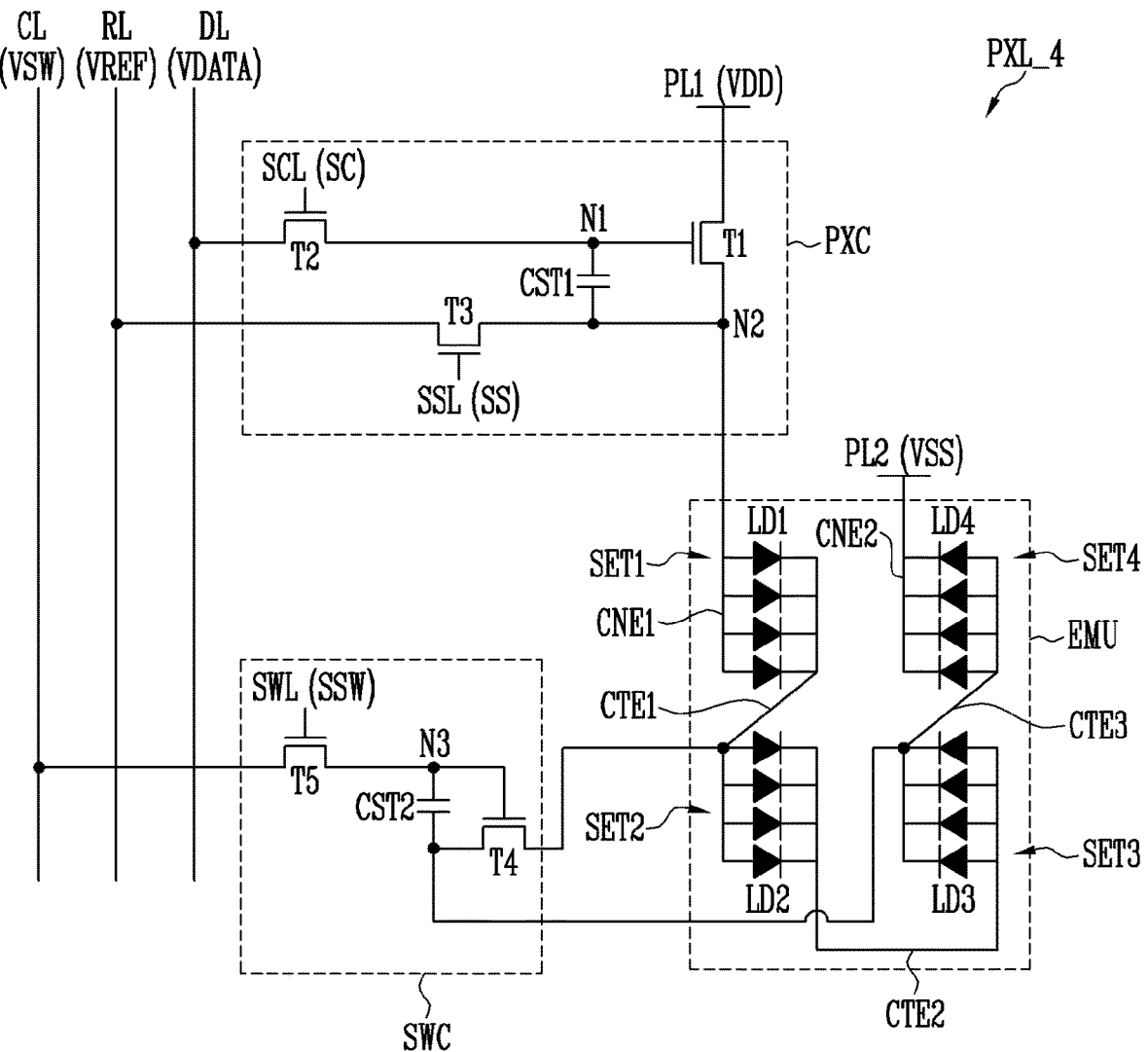

As illustrated in FIG. 13, the fourth transistor T4 of the pixel PXL_4 may be connected between the first intermediate electrode CTE1 and the third intermediate electrode CTE3. The first terminal of the fourth transistor T4 may be connected to the first intermediate electrode CTE1. The second terminal of the fourth transistor T4 may be connected to the third intermediate electrode CTE3. When a mode signal VSW having a gate-on voltage is supplied from the control line CL to the third node N3, the fourth transistor T4 may be turned on so that the first intermediate electrode CTE1 and the third intermediate electrode CTE3 can be electrically connected to each other. In this case, only the first and fourth light emitting elements LD1 and LD4 (or the first and fourth series sets SET1 and SET4) may emit light, and the second and third light emitting elements LD2 and LD3 (or the second and third series set SET2 and SET3) may not emit light.

Figure 14:
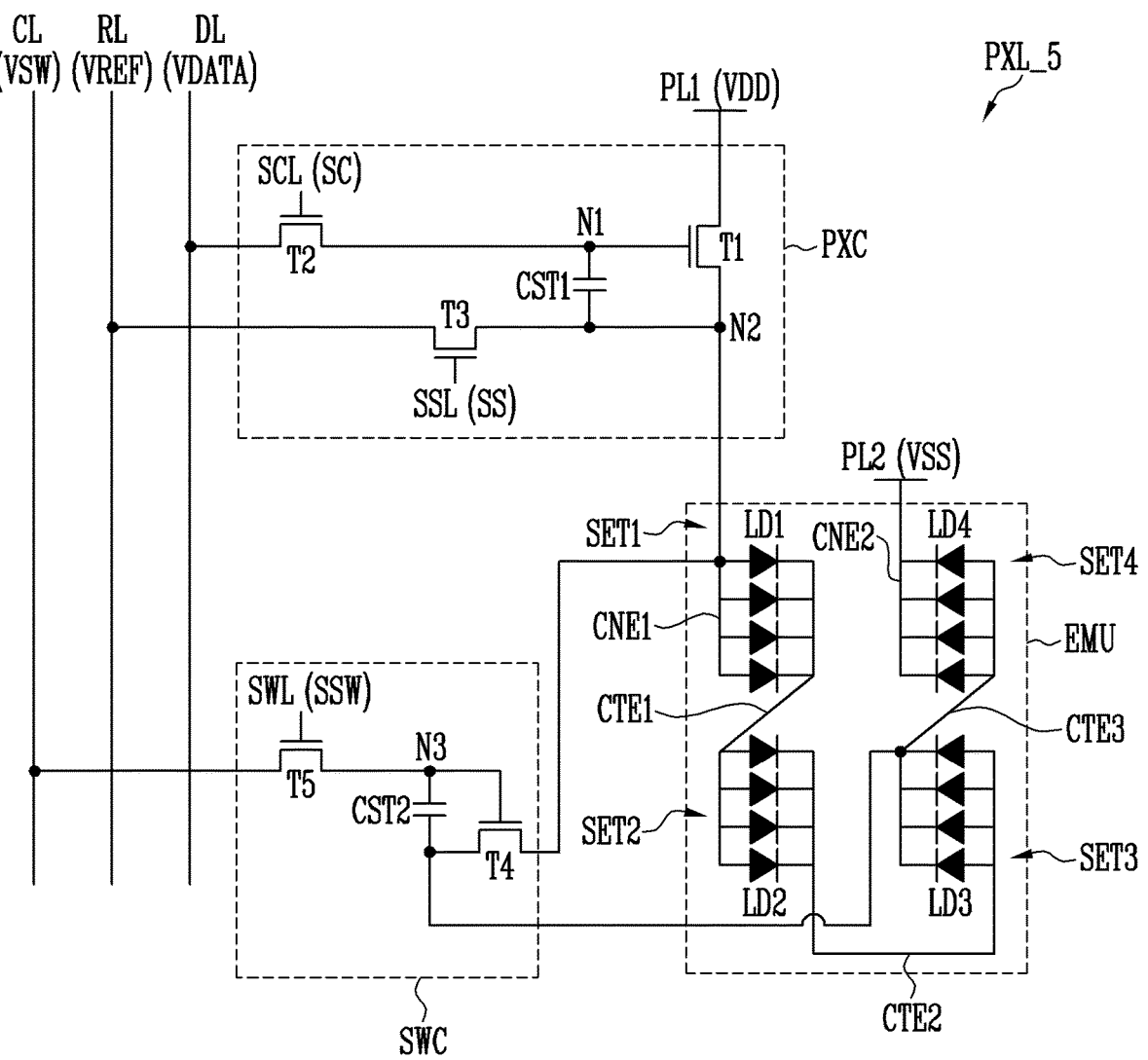

As illustrated in FIG. 14, the fourth transistor T4 of the pixel PXL_5 may be connected between the first contact electrode CNE1 and the third intermediate electrode CTE3. The first terminal of the fourth transistor T4 may be connected to the first contact electrode CNE1. The second terminal of the fourth transistor T4 may be connected to the third intermediate electrode CTE3. When a mode signal VSW having a gate-on voltage is supplied from the control line CL to the third node N3, the fourth transistor T4 may be turned on so that the first contact electrode CNE1 and the third intermediate electrode CTE3 can be electrically connected to each other. In this case, only the fourth light emitting element LD4 (or the fourth series set SET4) may emit light, and the first, second, and third light emitting elements LD1, LD2, and LD3 (or the first, second, and third series sets SET1, SET2, and SET3) may not emit light.

Although FIG. 14 illustrates that the second terminal of the fourth transistor T4 is connected to the third intermediate electrode CTE3, the present disclosure is not limited thereto. For example, the second terminal of the fourth transistor T4 may be connected to the first intermediate electrode CTE1 or the second intermediate electrode CTE2.

As described above, the fourth transistor T4 of the switching circuit SWC may be connected between two selected electrodes from among the first and second contact electrodes CNE1 and CNE2 and the intermediate electrodes CTE1 to CTE3. The number of series sets (or light emitting elements LD) of the emission component EMU may be adjusted in various ways.

Figure 15:
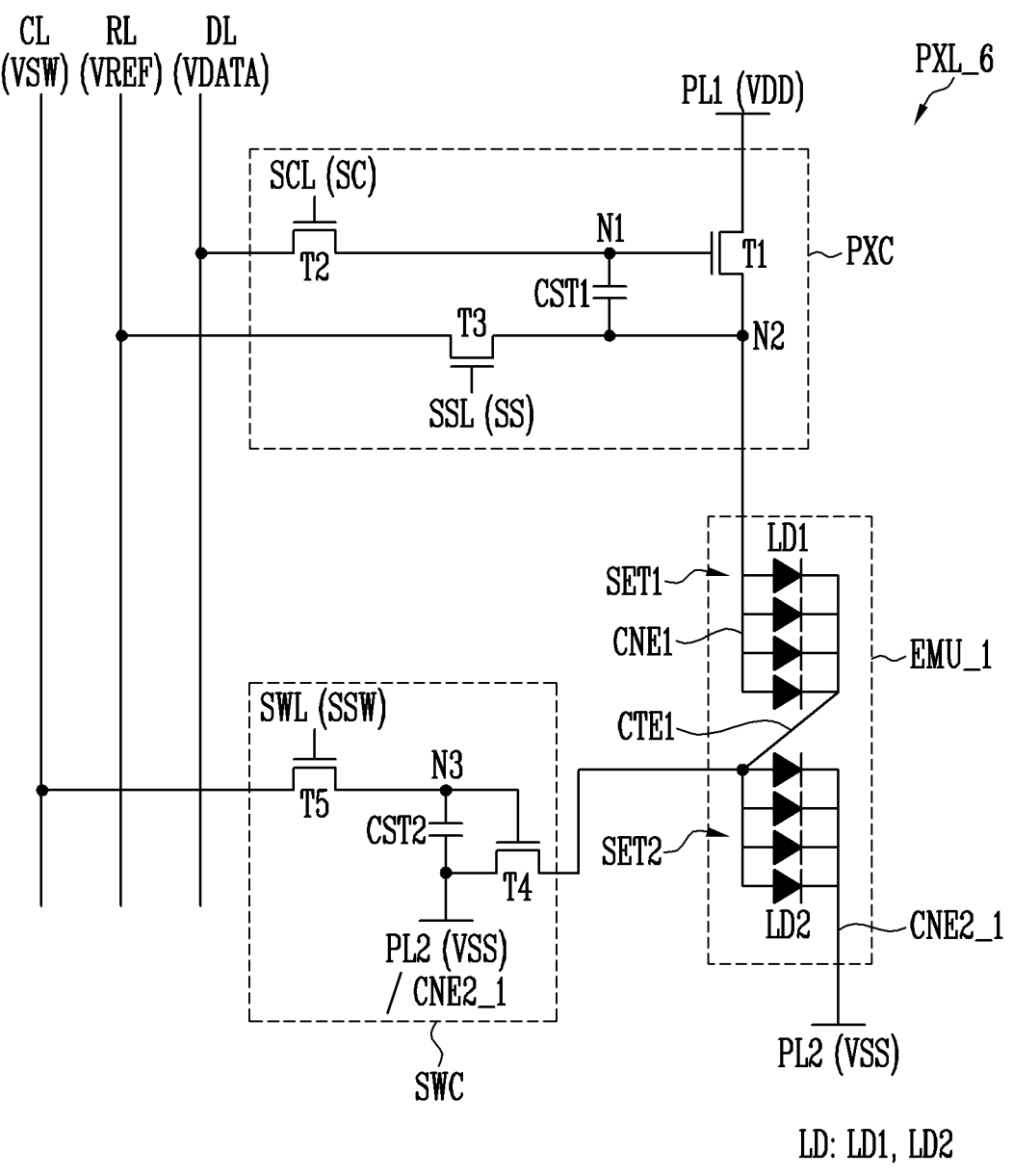
FIGS. 15 and 16 are circuit diagrams each illustrating an embodiment of the pixel included in the display device of FIG. 3.
Figure 16:
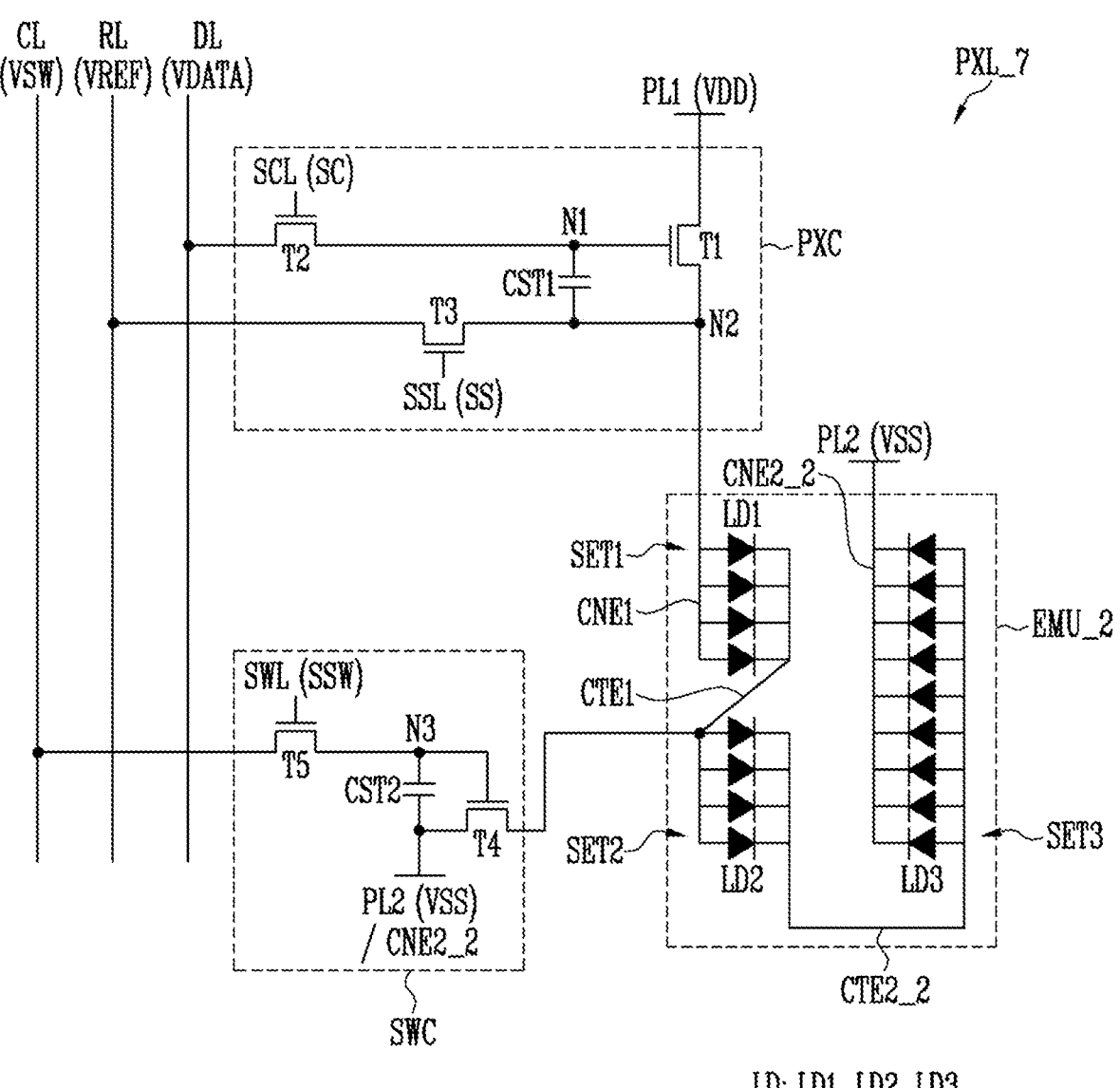

FIGS. 15 and 16 are circuit diagrams each illustrating an embodiment of the pixel included in the display device of FIG. 3.

Referring to FIGS. 3 to 5, 15, and 16, each of a pixel PXL_6 of FIG. 15 and a pixel PXL_7 of FIG. 16, other than the number of series sets in emission components EMU_1 and EMU_2, may be substantially identical or similar to the pixel PXL of FIG. 5. Therefore, repetitive explanation thereof will be omitted.

As illustrated in FIG. 15, the emission component EMU_1 may include first and second series sets SET1 and SET2, and may not include the third and fourth series sets SET3 and SET4 of FIG. 5.

The second light emitting element LD2 of the second series set SET2 may be connected in the forward direction between the first intermediate electrode CTE1 and a second contact electrode CNE2_1. For example, a first end of the second light emitting element LD2 may be connected to the first intermediate electrode CTE1, and a second end of the second light emitting element LD2 may be connected to the second contact electrode CNE2_1.

In this case, depending on an operation of the switching circuit SWC, the emission component EMU_1 may be operated in a structure including two series sets (i.e., the first and second series sets SET1 and SET2) or one series set (i.e., the first series set SET1).

As illustrated in FIG. 16, the emission component EMU_2 may include first, second, and third series sets SET1, SET2, and SET3 and may not include the fourth series set SET4 of FIG. 5.

The third light emitting element LD3 of the third series set SET3 may be connected in the forward direction between a second intermediate electrode CTE2_2 and a second contact electrode CNE2_2. For example, a first end of the third light emitting element LD3 may be connected to the second intermediate electrode CTE2_2, and a second end of the third light emitting element LD3 may be connected to the second contact electrode CNE2_2.

In this case, depending on an operation of the switching circuit SWC, the emission component EMU_2 may be operated in a structure including three series sets (i.e., the first, second, and third series sets SET1, SET2, and SET3) or one series set (i.e., the first series set SET1).

The embodiments of FIGS. 10 and 12 may be applied to the embodiment of FIG. 16. In other words, the fourth transistor T4 may be connected between other electrodes in lieu of the first intermediate electrode CTE1 and the second power line PL2.

Figure 17:
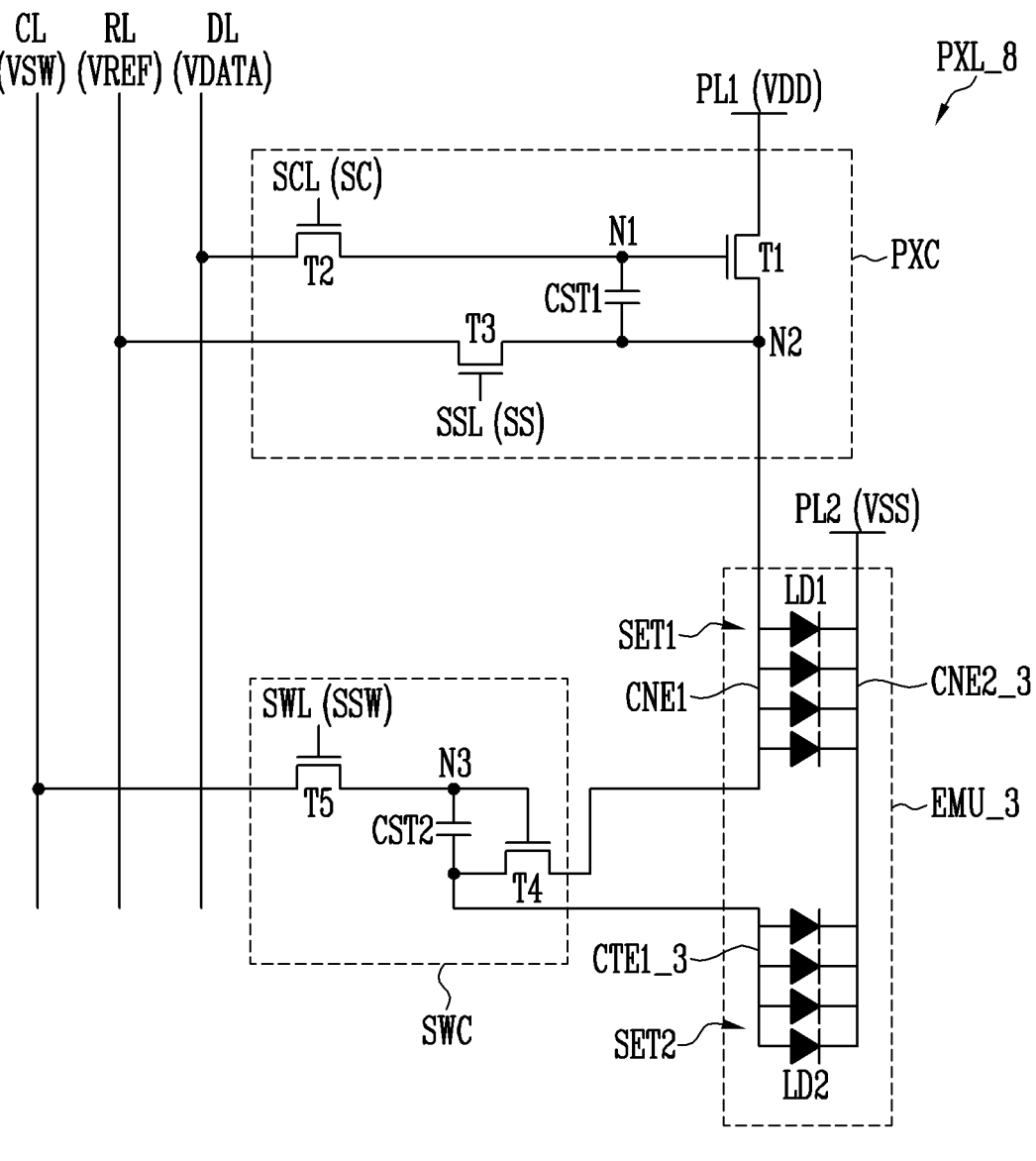
FIGS. 17 and 18 are circuit diagrams each illustrating an embodiment of the pixel included in the display device of FIG. 3.
Figure 18:
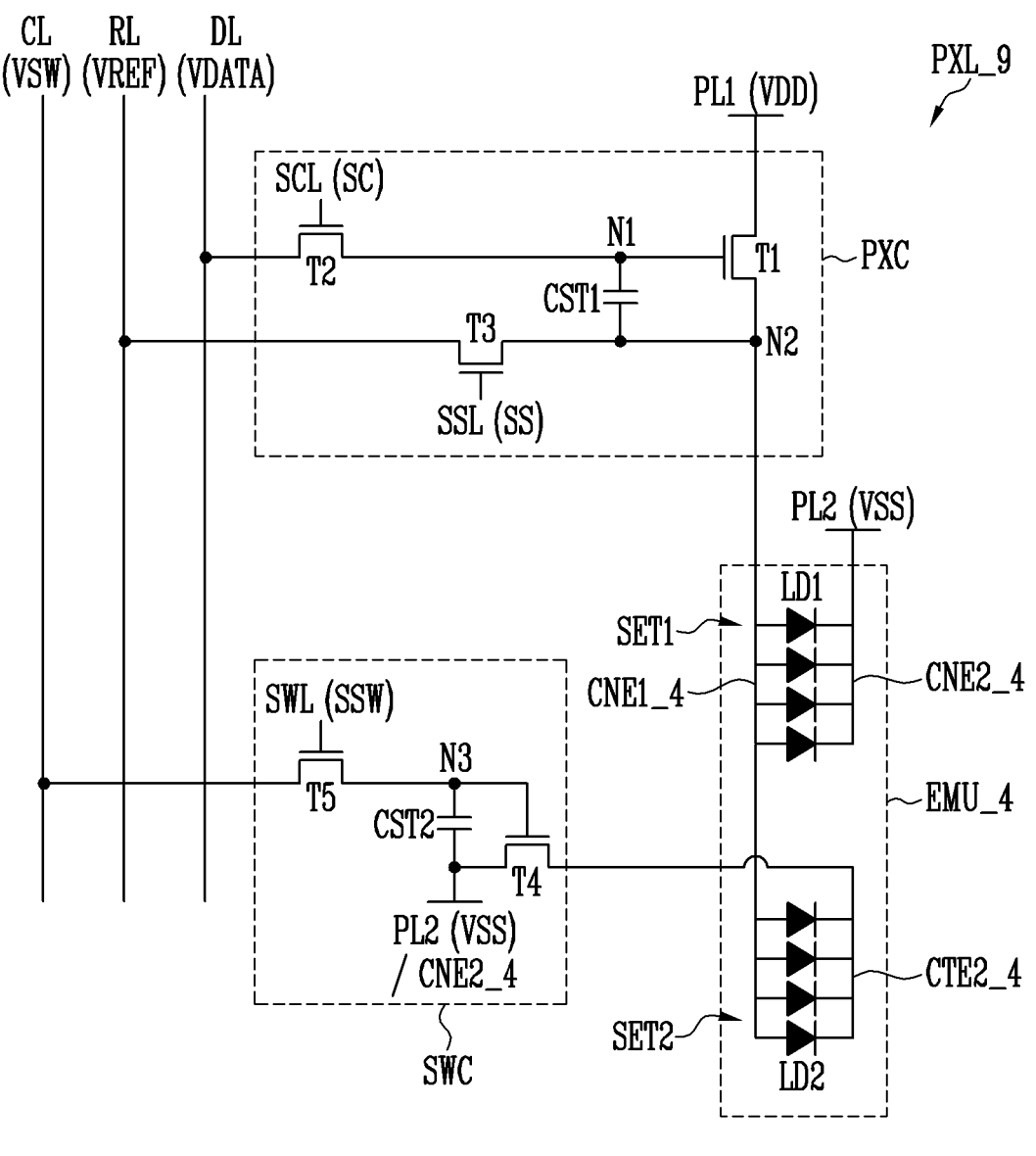

FIGS. 17 and 18 are circuit diagrams each illustrating an embodiment of the pixel included in the display device of FIG. 3.

Referring to FIGS. 3 to 5, 17, and 18, each of a pixel PXL_8 of FIG. 17 and a pixel PXL_9 of FIG. 18, other than structures of emission components EMU_3 and EMU_4 and the connection configuration of the fourth transistor T4, may be substantially identical or similar to the pixel PXL of FIG. 5. Therefore, repetitive explanation thereof will be omitted.

The first transistor T1 may transmit driving current to the first pixel electrode or the second pixel electrode. For example, the first contact electrode CNE1 of FIG. 17 may be the first pixel electrode, and the first transistor T1 may provide driving current to the first contact electrode CNE1.

For instance, in one or more embodiments, the second pixel electrode may be a first contact electrode CNE1_4 of FIG. 18, and the first transistor T1 may provide driving current to the first contact electrode CNE1_4.

Each of the emission component EMU_3 and EMU_4 may include light emitting elements LD connected in parallel to each other. The switching circuit SWC may adjust the number of light emitting elements LD. For example, the switching circuit SWC may adjust, by electrically connecting the first pixel electrode and the intermediate electrode to each other or separating them from each other, the number of light emitting elements LD connected in parallel to each other.

As illustrated in FIG. 17, the emission component EMU_3 may include the first contact electrode CNE1, a first intermediate electrode CTE1_3, and a second contact electrode CNE2_3, and first and second light emitting elements LD1 and LD2. The first light emitting element LD1 may be connected in the forward direction between the first contact electrode CNE1 (or the first pixel electrode) and the second contact electrode CNE2_3 (or the second pixel electrode). The second light emitting element LD2 may be connected in the forward direction between the first intermediate electrode CTE1_3 and the second contact electrode CNE2_3.

The fourth transistor T4 of the pixel PXL_8 may be connected between the first contact electrode CNE1 and the first intermediate electrode CTE1_3. The first terminal of the fourth transistor T4 may be connected to the first contact electrode CNE1. The second terminal of the fourth transistor T4 may be connected to the first intermediate electrode CTE1_3.

When a grayscale value for the pixel PXL_8 is a high grayscale value, a mode signal VSW having a gate-on voltage may be supplied from the control line CL to the third node N3, and the fourth transistor T4 of the pixel PXL_8 may be turned on in response to the mode signal VSW having the gate-on voltage so that the first contact electrode CNE1 and the first intermediate electrode CTE1_3 can be electrically connected to each other. In this case, driving current applied to the emission component EMU_3 may flow through the first and second light emitting elements LD1 and LD2 (or the first and second series sets SET1 and SET2). For example, eight light emitting elements LD may validly emit light.

When a grayscale value for the pixel PXL_8 is a low grayscale value, a mode signal VSW having a gate-off voltage may be supplied from the control line CL to the third node N3, and the fourth transistor T4 of the pixel PXL_8 may be turned off in response to the mode signal VSW having the gate-off voltage so that the first contact electrode CNE1 and the first intermediate electrode CTE1_3 can be electrically separated from each other. In this case, driving current applied to the emission component EMU_3 may flow through only the first light emitting element LD1 (or the first series set SET1), and may not flow through the second light emitting element LD2 (or the second series set SET2). For example, only four light emitting elements LD may validly emit light.

As illustrated in FIG. 18, the emission component EMU_4 may include a first contact electrode CNE1_4, a second intermediate electrode CTE2_4, and a second contact electrode CNE2_4, and first and second light emitting elements LD1 and LD2.

The first light emitting element LD1 may be connected in the forward direction between the first contact electrode CNE1_4 (or the second pixel electrode) and the second contact electrode CNE2_4 (or the first pixel electrode). The second light emitting element LD2 may be connected in the forward direction between the first contact electrode CNE1_4 and the second intermediate electrode CTE2_4.

The fourth transistor T4 of the pixel PXL_9 may be connected between the second intermediate electrode CTE2_4 and the second power line PL2 (or the second contact electrode CNE2_4). The first terminal of the fourth transistor T4 may be connected to the second intermediate electrode CTE2_4. The second terminal of the fourth transistor T4 may be connected to the second power line PL2 (or the second contact electrode CNE2_4).

When a grayscale value for the pixel PXL_9 is a high grayscale value, a mode signal VSW having a gate-on voltage may be supplied from the control line CL to the third node N3, and the fourth transistor T4 of the pixel PXL_9 may be turned on in response to the mode signal VSW having the gate-on voltage so that the second intermediate electrode CTE2_4 and the second power line PL2 (or the second contact electrode CNE2_4) can be electrically connected to each other. In this case, driving current applied to the emission component EMU_4 may flow through the first and second light emitting elements LD1 and LD2 (or the first and second series sets SET1 and SET2). For example, eight light emitting elements LD may validly emit light.

When a grayscale value for the pixel PXL_9 is a low grayscale value, a mode signal VSW having a gate-off voltage may be supplied from the control line CL to the third node N3, and the fourth transistor T4 of the pixel PXL_9 may be turned off in response to the mode signal VSW having the gate-off voltage so that the second intermediate electrode CTE2_4 and the second power line PL2 (or the second contact electrode CNE2_4) can be electrically separated from each other. In this case, driving current applied to the emission component EMU_4 may flow through only the first light emitting element LD1 (or the first series set SET1), and may not flow through the second light emitting element LD2 (or the second series set SET2). For example, only four light emitting elements LD may validly emit light.

As described above, even in the case where the emission components EMU_3 and EMU_4 each include only the light emitting elements LD that are connected in parallel to each other, the number of light emitting elements LD that validly emit light may be adjusted by the switching circuit SWC.

In a display device in accordance with one or more embodiments of the present disclosure, the number of light emitting elements that validly emit light in a pixel may be adjusted, and current that flows through the light emitting elements in response to a low-grayscale image may be relatively increased, so that representation performance (or display quality) for low-grayscale images can be enhanced.

The effects, aspects, and features of embodiments of the present disclosure are not limited by the foregoing, and other various effects, aspects, and features are anticipated herein.

While the spirit and scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the present disclosure as defined by the following claims.

The scope of the present disclosure is not limited by detailed descriptions of the present specification, and should be defined by the accompanying claims and their equivalents. Furthermore, all changes or modifications of the present disclosure derived from the meanings and scope of the claims, and equivalents thereof should be construed as being included in the scope of the present disclosure.

What is claimed is:

1. A display device comprising a driver and a pixel, the pixel comprising:
   a first electrode, a second electrode, and an intermediate electrode;
   light emitting elements comprising a first plurality of light emitting elements connected to each other in parallel and a second plurality of light emitting elements connected to each other in parallel, the first plurality of light emitting elements and the second plurality of light emitting elements being connected in series with each other through the intermediate electrode between the first electrode and the second electrode;
   a driving transistor configured to provide a driving current to the light emitting elements between a first power line and a second power line; and
   a first switching transistor connected in parallel with some of the light emitting elements and connected in series with remaining ones of the light emitting elements,
   wherein the driver is configured to control a switching operation of the first switching transistor based on a grayscale value of input image data.

2. The display device according to claim 1, wherein the first electrode is electrically connected to the first power line through the driving transistor, and
   wherein the second electrode is electrically connected to the second power line.

3. The display device according to claim 2, wherein the pixel further comprises:
   a hold capacitor between a second electrode of the first switching transistor and a gate electrode of the first switching transistor; and
   a second switching transistor configured to transmit a mode signal to the gate electrode of the first switching transistor,
   wherein a first electrode of the first switching transistor is electrically connected to the intermediate electrode.

4. The display device according to claim 3, wherein the second electrode of the first switching transistor is electrically connected to the second power line.

5. The display device according to claim 1, wherein the intermediate electrode comprises a first intermediate electrode, a second intermediate electrode, and a third intermediate electrode, and
   wherein:
      a first light emitting element of the first plurality of light emitting elements is electrically connected between the first electrode and the first intermediate electrode;
      a second light emitting element of the second plurality of light emitting elements is electrically connected between the first intermediate electrode and the second intermediate electrode; and
      the light emitting elements further comprise:
         a third light emitting element electrically connected between the second intermediate electrode and the third intermediate electrode; and
         a fourth light emitting element electrically connected between the third intermediate electrode and the second electrode.

6. The display device according to claim 5, wherein the first switching transistor is turned on to electrically connect the first intermediate electrode to the second power line.

7. The display device according to claim 5, wherein the first switching transistor is turned on to electrically connect the second intermediate electrode to the second power line.

8. The display device according to claim 5, wherein the first switching transistor is turned on to electrically connect the third intermediate electrode to the second power line.

9. The display device according to claim 1, wherein each of the light emitting elements comprises an inorganic light emitting diode.

10. A display device comprising a data processor, a driver, and a pixel, the pixel comprising:
    a first electrode, a second electrode, and an intermediate electrode;
    light emitting elements, at least some of the light emitting elements being connected in series with each other through the intermediate electrode between the first electrode and the second electrode;
    a driving transistor configured to provide a driving current to the light emitting elements between a first power line and a second power line; and
    a first switching transistor connected in parallel with some of the light emitting elements and connected in series with remaining ones of the light emitting elements;
    a hold capacitor between a second electrode of the first switching transistor and a gate electrode of the first switching transistor; and
    a second switching transistor configured to transmit a mode signal to the gate electrode of the first switching transistor,
    wherein the first electrode is electrically connected to the first power line through the driving transistor,
    wherein the second electrode is electrically connected to the second power line,
    wherein a first electrode of the first switching transistor is electrically connected to the intermediate electrode,
    wherein the data processor is configured to output a determination result by determining whether a grayscale value included in image data is less than a reference grayscale value, and
    wherein the driver is configured to generate the mode signal for turning on or turning off the first switching transistor based on the determination result of the data processor.

11. The display device according to claim 10, wherein, when the grayscale value is less than the reference grayscale value, the first switching transistor is turned on, the some of the light emitting elements do not emit light, and the remaining ones of the light emitting elements emit light.

12. The display device according to claim 10, wherein, when the grayscale value is greater than or equal to the reference grayscale value, the first switching transistor is turned off, and all of the light emitting elements emit light.

13. A display device comprising a driver and a pixel, the pixel comprising:
    a first pixel electrode, a second pixel electrode, and an intermediate electrode;
    first light emitting elements electrically connected between the first pixel electrode and the second pixel electrode, the first light emitting elements being connected in parallel to each other;
    second light emitting elements electrically connected between the intermediate electrode and the second pixel electrode, the second light emitting elements being connected in parallel to each other;
    a driving transistor configured to transmit a driving current to the first pixel electrode or the second pixel electrode between a first power line and a second power line; and
    a first switching transistor configured to electrically connect the first pixel electrode to the intermediate electrode or electrically separate the first pixel electrode from the intermediate electrode, wherein the driver is configured to control a switching operation of the first switching transistor based on a grayscale value of input image data.

14. The display device according to claim 13, wherein the first pixel electrode is electrically connected to the first power line through the driving transistor, and wherein the second pixel electrode is electrically connected to the second power line.

15. The display device according to claim 13, wherein the second pixel electrode is electrically connected to the first power line through the driving transistor, and wherein the first pixel electrode is electrically connected to the second power line.

16. The display device according to claim 13, wherein, when the first switching transistor is turned off, the first light emitting elements emit light, and the second light emitting elements do not emit light, and wherein, when the first switching transistor is turned on, the first light emitting elements and the second light emitting elements emit light.

17. The display device according to claim 13, wherein the pixel further comprises:

a hold capacitor between a second electrode of the first switching transistor and a gate electrode of the first switching transistor; and a second switching transistor configured to transmit a mode signal to the gate electrode of the first switching transistor.

18. The display device according to claim 17, further comprising:

a data processor configured to output a determination result by determining whether the grayscale value included in the input image data is less than a reference grayscale value, wherein the driver is configured to generate the mode signal for turning on or turning off the first switching transistor based on the determination result of the data processor.

19. The display device according to claim 18, wherein, when the grayscale value is less than the reference grayscale value, the first switching transistor is turned on.

20. The display device according to claim 18, wherein, when the grayscale value is greater than or equal to the reference grayscale value, the first switching transistor is turned off.

\*  \*  \*  \*  \*